(12) United States Patent
Hafed

(10) Patent No.: US 7,681,091 B2
(45) Date of Patent: Mar. 16, 2010

(54) SIGNAL INTEGRITY MEASUREMENT SYSTEMS AND METHODS USING A PREDOMINANTLY DIGITAL TIME-BASE GENERATOR

(75) Inventor: Mohamed M. Hafed, Montreal (CA)

(73) Assignee: DFT Microsystems, Inc., Burlington, MA (US)

( * ) Notice: Subject to any disclaimer, the term of this patent is extended or adjusted under 35 U.S.C. 154(b) by 247 days.

(21) Appl. No.: 11/776,825

(22) Filed: Jul. 12, 2007

(65) Prior Publication Data
US 2008/0048726 A1 Feb. 28, 2008

Related U.S. Application Data

(60) Provisional application No. 60/830,797, filed on Jul. 14, 2006.

(51) Int. Cl.
G06K 5/04 (2006.01)
G06K 5/00 (2006.01)
G06F 11/00 (2006.01)

(52) U.S. Cl. .................. 714/700; 714/798; 324/76.58; 324/76.68

(58) Field of Classification Search .................. None
See application file for complete search history.

(56) References Cited

U.S. PATENT DOCUMENTS

| 3,931,610 A | 1/1976 | Marin et al. |
| 3,976,940 A | 8/1976 | Chau et al. |
| 4,677,648 A | 6/1987 | Zurfluh |
| 4,807,147 A | 2/1989 | Halbert et al. |
| 5,329,258 A | 7/1994 | Matsuura |
| 5,517,147 A | 5/1996 | Burroughs et al. |
| 5,563,921 A | 10/1996 | Mesuda et al. |
| 5,835,501 A | 11/1998 | Dalmia et al. |
| 5,883,523 A | 3/1999 | Ferland et al. |
| 5,948,115 A | 9/1999 | Dinteman |

(Continued)

FOREIGN PATENT DOCUMENTS

JP 2005006071 A 1/2005

OTHER PUBLICATIONS

Hafed et al., "A High-Throughput 5 GBPS Timing and Jitter Test Module Featuring Localized Processing," International Test Conference 2004, Oct. 26, 2004-Oct. 28, 2004 Charlotte Convention Center, Charlotte, NC, ETATS-UNIS (2004), IEEE Catalog No. 04CH37586, ISBN: 0-7803-8580-2, pp. 728-737.

(Continued)

Primary Examiner—Christine T Tu
(74) Attorney, Agent, or Firm—Downs Rachlin Martin PLLC

(57) ABSTRACT

Signal-integrity measurement systems and methods utilizing unique time-base generation techniques for controlling the sampling of one or more signals under test. A time-base generator made in accordance with the present disclosure includes a phase filter and modulation circuitry that generates a rapidly varying phase signal as a function of the output of a sigma-delta modulator. The phase filter filters unwanted high-frequency phase components from the rapidly varying phase signal. The filtered signal is used to clock one or more samplers so as to create sampling instances of the signal(s) under test. The sampling instances are then analyze using any one or more of a variety of techniques suited to the type of signal(s) under test.

72 Claims, 11 Drawing Sheets

U.S. PATENT DOCUMENTS

| | | | |
|---|---|---|---|
| 6,008,703 | A | 12/1999 | Perrott et al. |
| 6,057,679 | A * | 5/2000 | Slizynski et al. ......... 324/158.1 |
| 6,076,175 | A | 6/2000 | Drost et al. |
| 6,091,671 | A | 7/2000 | Kattan |
| 6,181,267 | B1 | 1/2001 | MacDonald et al. |
| 6,225,840 | B1 | 5/2001 | Ishimi |
| 6,329,850 | B1 | 12/2001 | Mair et al. |
| 6,356,850 | B1 | 3/2002 | Wilstrup et al. |
| 6,374,388 | B1 | 4/2002 | Hinch |
| 6,420,921 | B1 | 7/2002 | Okayasu et al. |
| 6,570,454 | B2 | 5/2003 | Skierszkan |
| 6,629,274 | B1 | 9/2003 | Tripp et al. |
| 6,640,193 | B2 | 10/2003 | Kuyel |
| 6,650,101 | B2 | 11/2003 | MacDonald et al. |
| 6,658,363 | B2 | 12/2003 | Mejia et al. |
| 6,665,808 | B1 | 12/2003 | Schinzel |
| 6,768,360 | B2 | 7/2004 | Tsuruki |
| 6,768,390 | B1 | 7/2004 | Dunsmore et al. |
| 6,775,809 | B1 | 8/2004 | Lambrecht et al. |
| 6,785,622 | B2 | 8/2004 | Nygaard, Jr. |
| 6,791,389 | B2 | 9/2004 | Mikami et al. |
| 6,816,987 | B1 | 11/2004 | Olson et al. |
| 6,816,988 | B2 | 11/2004 | Barford |
| 6,834,367 | B2 | 12/2004 | Bonneau et al. |
| 6,842,061 | B2 | 1/2005 | Suda et al. |
| 6,859,106 | B2 | 2/2005 | Sano |
| 6,865,222 | B1 | 3/2005 | Payne |
| 6,865,496 | B2 | 3/2005 | Camnitz et al. |
| 6,868,047 | B2 | 3/2005 | Sartschev et al. |
| 6,888,412 | B2 | 5/2005 | Kim et al. |
| 6,907,553 | B2 | 6/2005 | Popplewell et al. |
| 6,909,316 | B2 | 6/2005 | Owens et al. |
| 6,909,980 | B2 | 6/2005 | Fernando |
| 6,918,073 | B2 | 7/2005 | Linam et al. |
| 6,931,579 | B2 | 8/2005 | Roberts et al. |
| 6,934,896 | B2 | 8/2005 | Larson et al. |
| 6,940,330 | B2 | 9/2005 | Okayasu |
| 6,944,835 | B2 | 9/2005 | Okayasu |
| 6,961,745 | B2 | 11/2005 | Laquai |
| 6,993,109 | B2 | 1/2006 | Lee et al. |
| 7,136,772 | B2 | 11/2006 | Duchi et al. |
| 7,287,200 | B2 * | 10/2007 | Miyaji ........................ 714/700 |
| 7,355,378 | B2 * | 4/2008 | Rottacker et al. ........ 324/76.42 |
| 2001/0028251 | A1 | 10/2001 | Okayasu |
| 2002/0019962 | A1 | 2/2002 | Roberts et al. |
| 2002/0033878 | A1 | 3/2002 | Satoh et al. |
| 2003/0122600 | A1 | 7/2003 | Engl et al. |
| 2003/0128720 | A1 | 7/2003 | Jones |
| 2003/0165051 | A1 | 9/2003 | Kledzik et al. |
| 2003/0198311 | A1 | 10/2003 | Song et al. |
| 2004/0051571 | A1 | 3/2004 | Okamura |
| 2005/0014300 | A1 | 1/2005 | Welch et al. |
| 2005/0046584 | A1 | 3/2005 | Breed |
| 2005/0058234 | A1 | 3/2005 | Stojanovic |
| 2005/0094927 | A1 | 5/2005 | Kish et al. |
| 2005/0286436 | A1 | 12/2005 | Flask |
| 2006/0005093 | A1 | 1/2006 | Leslie |
| 2006/0139387 | A1 | 6/2006 | Silverbrook et al. |
| 2007/0113119 | A1 | 5/2007 | Hafed |
| 2008/0013456 | A1 | 1/2008 | Hafed |
| 2008/0192814 | A1 | 8/2008 | Hafed et al. |

OTHER PUBLICATIONS

Hafed, et al., "An 8-Channel, 12-bit, 20 MHz Fully Differential Tester IC For Analog and Mixed-Signal Circuits," Solid-State Circuits Conference, 2003, ESSCIRC 2003, proceedings of the 29th European; Published Sep. 16, 2003, pp. 193-196; ISBN: 0-7803-7995-0.

Hafed et al., "A 5-Channel, Variable Resolution 10-GHz Sampling Rate Coherent Tester/Oscilloscope IC and Associated Test Vehicles," IEEE Mar. 2003, Custom Integrated Circuits Conference, pp. 621-624.

Hafed et al., "A 4-GHz Effective Sample Rate Integrated Test Core for Analog and Mixed-Signal Circuits," IEEE Journal of Solid-State Circuits, vol. 37, No. 4, Apr. 2002, pp. 499-514.

Hafed et al., "Test and Evaluation of Multiple Embedded Mixed-Signal Test Cores," International Test Conference 2002, paper 35.3, ISBN 0-7803-7542-4, pp. 1022-1030.

Hafed et al., "Sigma-Delta Techniques for Integrated Test and Measurement," IEEE Instrumentation and Measurement Technology Conference, Budapest, Hungary, May 21-23, 2001; 0-7803-6646.

Larsson, Patrick, "A 2-1600-MHz CMOS Clock Recovery PLL with Low-Vdd Capability," In Solid-State Circuits, IEEE Journal, Dec. 1999, vol. 34, Issue 12, pp. 1951-1960.

International Search Report and Written Opinion dated Feb. 12, 2008 for corresponding PCT application PCT/US06/60295 filed Oct. 27, 2006 entitled "High-Speed Transceiver Tester Incorporating Jitter Injection," Hafed et al.

Mohamed Hafed et al, "Massively Parallel Validation of High-Speed Serial Interfaces Using Compact Instrument Modules," IEEE, International Test Conference, Paper 9.2; 1-4244-0292, Jan. 2, 2006, pp. 1-10.

International Search Report and Written Opinion dated Jul. 22, 2008 for related application PCT/US08/53476 filed Feb. 8, 2008 entitled "System and Method for Physical-Layer Testing of High-Speed Serial Links in their Mission Environment," Hafed et al.

International Search Report and Written Opinion dated Mar. 11, 2008 for related application PCT/US07/73458 filed Jul. 13, 2007 entitled "High-Speed Signal Testing System Having Oscilloscope Functionability," Hafed.

Related application U.S. Appl. No. 12/026,760 filed Feb. 6, 2008 entitled "Systems and Methods for Testing and Diagnosing Delay Faults and for Parametric Testing in Digital Circuits," Hafed.

International Search Report and Written Opinion dated Aug. 1, 2008 for related application PCT/US07/73454 filed Jul. 13, 2007 entitled "Signal Integrity Measurement System and Methods Using a Predominantly Digital Time-Base Generator," Hafed.

First Office Action dated Sep. 2, 2009 in connection with related U.S. Appl. No. 11/776,865, filed Jul. 12, 2007, entitled "High-Speed Signal Testing System Having Oscilloscope Functionality," Inventor: Mohamed Hafed.

* cited by examiner

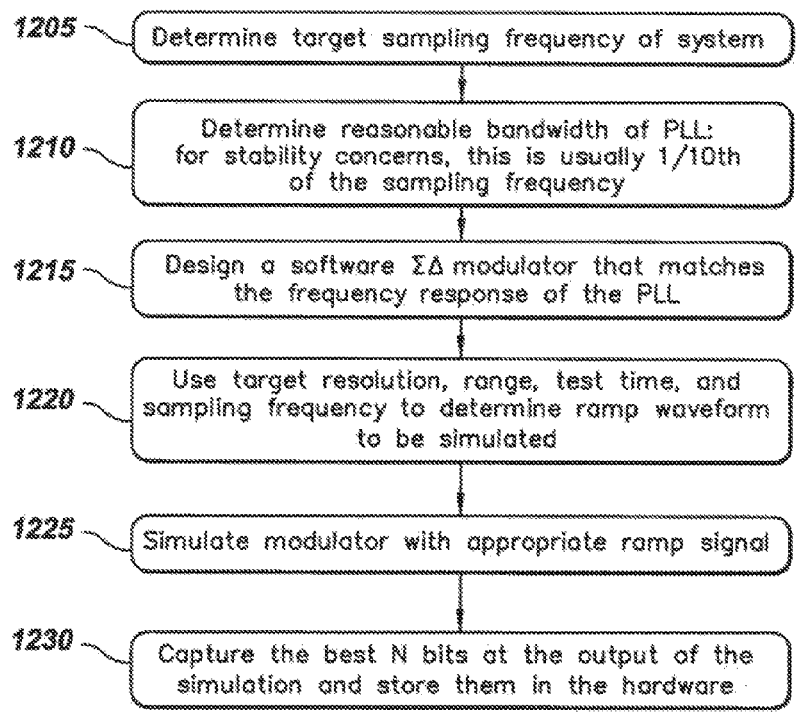
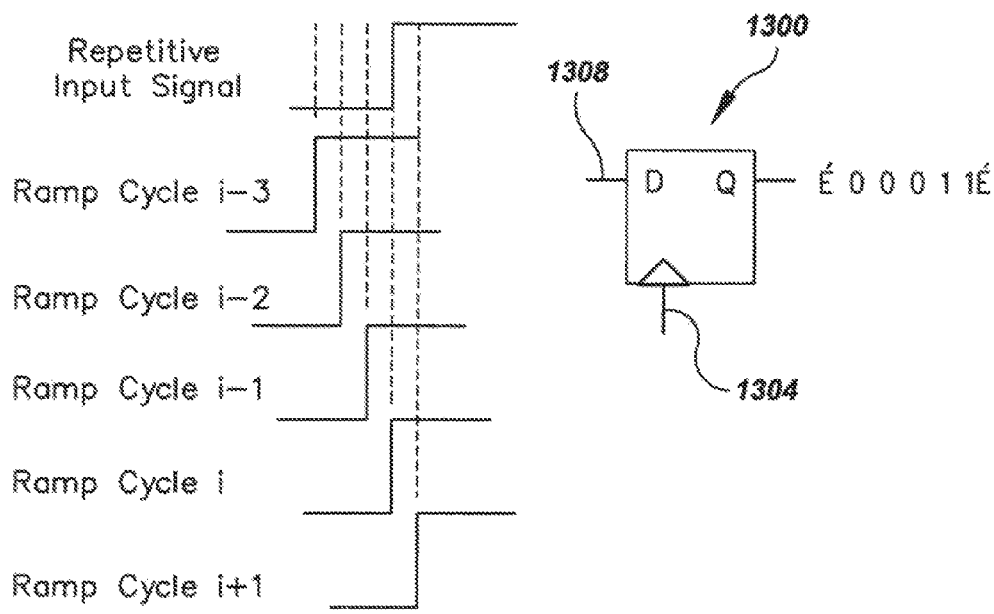

SIGNAL INTEGRITY MEASUREMENT SYSTEMS AND METHODS USING A PREDOMINANTLY DIGITAL TIME-BASE GENERATOR

RELATED APPLICATION DATA

This application claims the benefit of priority of U.S. Provisional Patent Application Ser. No. 60/830,797, filed on Jul. 14, 2006, and titled "Signal Integrity Measurement System And Method Using A Predominantly Digital Time-Base Generator," which is incorporated herein by reference in its entirety.

FIELD OF INVENTION

The present invention relates generally to signal integrity measurement of digital circuits and systems. More particularly, the present invention is directed to signal integrity measurement systems and methods of using a predominantly digital time-base generator.

BACKGROUND

While digital circuits are ultimately intended to process discrete values—such as "0" and "1," at the semiconductor device level, such circuits invariably encode discrete signals using physical quantities such as voltage and current. Consequently, when digital signals transition inside or outside a semiconductor device, they cause analog transients in voltage level, current level, or both. As technology advances, this "analog" behavior of digital circuits becomes increasingly relevant to the correct operation of a semiconductor device. For example, if the time it takes for a voltage to transition from a "0"-level to a "1"-level is excessively long, the semiconductor device may cease to operate altogether. Similarly, if a logical "1" ("0") is encoded using too low (high) a voltage or current, the resulting circuit could fail to operate correctly. Other examples of analog phenomena include timing uncertainty or tolerance to timing uncertainty. As a specific example, consider two semiconductor devices that are expected to communicate with each other over a copper wire. If the timing of the digital signals from the source to the destination is excessively perturbed, the resulting communication link could be corrupted. Apart from the above "behind-the-scenes" analog behavior of digital circuits, it is often necessary to momentarily and deliberately convert digital signals into analog signals for ease of processing and implementation, as would be the case in a wireless communications system.

The evaluation of the analog behavior of circuits is a very important step in the semiconductor industry. Circuits and systems designers always need test and measurement tools to debug, characterize, and production-test their designs. These test and measurement tools can take on several forms. In general, various bench tools are available for signal integrity measurements, such as oscilloscopes (to measure voltage or current or electromagnetic waves in general), jitter analyzers (to measure timing uncertainty), and spectrum analyzers (to measure frequency). Such instruments have historically been well suited to measure the interface portion of a semiconductor device, e.g., the input and output ports. However, entire systems are currently being constructed onto a very small form factor. The current-generation test and measurement technology is not capable of analyzing internal circuitry because of access difficulties. To test is to disturb, so transferring a very low level signal from the micro-scale of a modern device to the macro scale of the test instrument is too disruptive to the signal being measured.

Modern measurement instruments almost invariably rely on powerful digital signal processing (DSP) techniques to facilitate automation and to enhance measurement accuracy and repeatability. Using DSP techniques, a device-under-test (DUT) response signal is measured by first digitizing it using an accurate analog-to-digital (A/D) converter. Subsequently, microprocessor-based computations are performed in order to analyze the digitized signals. For example, hardware or software implementations of a Fast Fourier Transform (FFT) are utilized before displaying the results to a user monitor.

The digitization step involves a clocking circuit, often called a "time-base generator" in oscilloscope terminology, in addition to the A/D converter. In general, the clocking circuit is the most important and most challenging component in an instrument such as an oscilloscope or a jitter analyzer in terms of design and implementation. Referring to FIGS. 1A and 1B, which illustrate the digitization of an analog waveform 10, the clocking circuit defines a horizontal (time) axis 12 against which signal parameters of the waveform are traced and measured. The more accurate the signal parameters can be traced along horizontal axis 12, the more accurate the overall measurement. Accuracy is increased by increasing the frequency of the sampling clock signal 14 output by the clocking circuit to a conventional A/D converter 16. Much of the clocking challenges occur when the signal frequency is faster than half of the clocking circuit frequency. Under this condition, conventional A/D converter 16 output exhibits aliasing and measurements become erroneous. Unfortunately, most measurement applications fall into this category. A lot of advancement has to be made in the area of clocking and digitization for digitizing high-frequency signals.

Still referring to FIGS. 1A and 1B, all modern digitization techniques generally revolve around placing the sampling instants of A/D converter 16 as close to each other as possible. Real-time oscilloscopes literally create multiple delayed replicas of a single "slow" clock signal and use each of the replicas to clock a separate A/D converter. This is illustrated in the time-interleaved A/D converter architecture 20 of FIG. 2. If 16 copies of a clock signal 22 are created and each is delayed by $1/16^{th}$ of the period with respect to the other, then an effective digitization frequency that is 16 times faster than the slow clock can be achieved. All that needs to be done is to combine the outputs of all 16 A/D converters 24 to create an aggregate digitized waveform. An example of such implementation is the Agilent 54855A digital sampling oscilloscope, available from Agilent Technologies, Santa Clara, Calif. Such implementation is extremely costly, requires rather large implementation area, and involves significant calibration procedures. These limitations make this technology generally suitable only for single-channel high-end equipment such as wide-bandwidth oscilloscopes. For obvious reasons it is not suited for integration as a signal-integrity measurement macro within a semiconductor device.

Alternatively, equivalent-time or sub-sampling instruments are constructed that relax the clock circuit frequency requirements significantly. In such instruments, the requirement to digitize signals in real-time is relaxed. Instead of creating multiple delayed copies of a clock, one sub-sampling approach takes multiple conversion passes to digitize a repetitive signal using a single clock signal. The repetitive signal can have a bandwidth that is much higher than the single clock signal used for digitization. First, the "slow" clock is used with a zero phase delay to sample the first input test period. The clock is then incremented by $\Delta t_s$ seconds on each subsequent run of the repetitive signal under test until the sampling clock has been delayed by the equivalent of one period. A total phase shift of approximately one period ensures that complete coverage of the input waveform is obtained with a timing resolution of $\Delta t_s$ seconds, although such complete coverage is not always necessary in many applications. FIG. 3 provides a graphical representation 30 of this sub-sampling algorithm (UTP in FIG. 3 means "unit test period"). A possible hardware implementation 40 is illustrated simplistically in FIG. 4, and it involves a delay chain 42 that can generate accurate phase delays and a multiplexer 44 for selecting the appropriate phase-delayed clocks (not shown).

Both methods described above have serious limitations associated with the reliable generation of small delay increments and with accumulated jitter in any circuitry that generates such delay increments. The impact of unwanted jitter on A/D-converter performance can be severe, and in the case of test and measurement applications, jitter is often the very phenomenon being measured. More importantly, delay-line resolution in most available semiconductor technologies is often 10 to 100 times more than what is required from a measurement instrument. In jitter measurement for example, one often needs delay increments of 1 psec or even 100 fsec, whereas delay line resolution in the best of cases is limited to about 50 psec. To combat this limitation, some sub-sampling architectures employ even more hardware to enhance the delay line resolution. Consider, for example, the vernier delay line circuitry 50 of FIG. 5. Instead of delaying just the sampling clock signal 52 of the A/D converter 54, the input signal 56 being measured is itself delayed, albeit by a slightly different amount. By controlling the delay of input signal 56 with respect to the delay of clock signal 52, effective resolution that is less than the absolute minimum delay of each of the individual delay lines can be achieved. This concept is referred to as a "vernier delay line." Apart from the obvious increase in implementation area, it is extremely difficult to match the delay values of both vernier delay lines. No published results have demonstrated less than about 20 psec delay resolution.

As an alternative to vernier delay lines, offset frequency sampling can be employed. A fractional frequency divider is used to clock the A/D converter at a rate $1/(T+\Delta T)$ that is slightly offset from the repetition rate, $1/T$, of the signal being measured. Sampling the input signal with such a clock ensures that one point per input signal period is sampled and that the sample point moves $\Delta t$ seconds relative to the previous sampling instant on the next run of the input signal. A high sampling resolution, $1/\Delta t$, can be achieved using this method, but this requires a high accuracy frequency synthesizer. Indeed commercial implementations of this technique involve a significantly more elaborate scheme than what has just been described. For some applications such as built-in test, such as disclosed in U.S. Pat. No. 7,158,899, these elaborate schemes cannot be employed, thus rendering the performance of the resulting solution very questionable. Effectively, the scheme of the '899 patent relies on two free-running oscillators that will undoubtedly wander significantly with respect to each other. Controlling the wander or filtering it out in a post-processing step is extremely challenging.

Other innovative equivalent-time technologies are similarly employed in high-performance oscilloscopes, such as disclosed in U.S. Pat. No. 6,650,101, and they all attempt to achieve the same goal of creating the perfect time-base. Similarly, in the context of jitter measurement applications, other measurement techniques exist, such as the techniques disclosed in U.S. Pat. No. 6,449,570, but they again all revolve around translating very small time increments into more manageable time delays.

SUMMARY OF THE DISCLOSURE

One aspect of the present invention is a tester for testing a circuit under test, comprising a time-base generator for generating a time-base signal as a function of a first clock signal, the time-base generator including: modulation circuitry for generating a rapidly varying phase signal as a function of the first clock signal; and a phase filter for receiving the rapidly varying phase signal and filtering therefrom unwanted high-frequency phase components so as to output the time-base signal; and a sampler for sampling a signal under test as a function of the time-base signal so as to output a sampled signal.

Another aspect of the present invention is a method of testing a circuit under test, comprising: stimulating the circuit under test to produce a response signal under test; generating a rapidly varying phase signal as a function of a first clock signal; filtering the rapidly varying phase signal to remove unwanted high-frequency phase components so as to generate a fine resolution time-base signal; and sampling the response signal under test as a function of the time-base signal so as to provide a sampled signal under test.

Still another aspect of the present invention is a method of testing a circuit under test, comprising: stimulating the circuit under test to produce a response signal under test; generating a rapidly varying phase signal as a function of a first clock signal; filtering the rapidly varying phase signal to remove unwanted high-frequency phase components so as to generate a fine resolution time-base signal; and sampling the response signal under test as a function of the time-base signal so as to provide a sampled signal under test.

Still another aspect of the present invention is a method of providing a time-base generator for a tester, comprising: determining a target sampling frequency for the tester; defining a bandwidth for a phase filter, the phase filter having a frequency response; providing a sigma-delta modulator as a function of the frequency response of the phase filter; simulating the sigma-delta modulator with a waveform so as to provide a simulation; selecting a finite-length sequence at the output of the simulation; and providing a sampler for sampling test data in response to the output of the sigma-delta modulator.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 12 is a flow diagram illustrating a design and simulation process for using a time-base generator of the present disclosure;

FIG. 13 is a diagram illustrating a principle of time-digitization using a sampling D-flip-flop coupled to a time-base generator of the present disclosure;

DETAILED DESCRIPTION 1.0 Overview

For the purposes of various embodiments of signal-integrity measurement systems and methods of present invention, unique time-base generation techniques are utilized that can achieve 100 fsec sampling resolution, or less, while deploying extremely simple hardware. As described below, signal-integrity measurement solutions disclosed herein are free of various limitations that plague conventional testing systems, such as delay line non-linearity, area overhead, jitter, and even wander between offset frequency oscillators. Instead, the disclosed time-based generation techniques offer deterministic sampling instants at an extremely fine resolution. Fine resolution is defined here as any delay resolution that is less than the minimum attainable using conventional delay lines. These time-base generation techniques may be implemented in conjunction with various samplers and various digital signal collecting and processing techniques to enable extremely efficient signal-integrity measurement macros that can be deployed, for example, in built-in self-test applications, as well as in stand-alone miniature instruments.

The disclosed subject matter can be used to create an extremely compact signal-integrity measurement tool that can be applied to the measurement of the interface portion of a semiconductor device as well as internal portions of the device. The disclosed embodiments also overcome some of the cost and performance challenges of conventional technology. Conventional test and measurement technology is always expected to supersede the general technology that it is intended to characterize. It thus typically relies on exotic materials and costly processes. The disclosed embodiments of the present invention, however, allow for the exploitation of low-cost semiconductor technology (often the same technology as the device(s) being characterized) to achieve extremely fine resolution measurement of signals. Several attempts have been made in the past to exploit low-cost technology, but these have always been marred by the resulting lack of performance that arises. Generally, the disclosed embodiments of the present invention do not suffer from such penalties.

Figure 6:
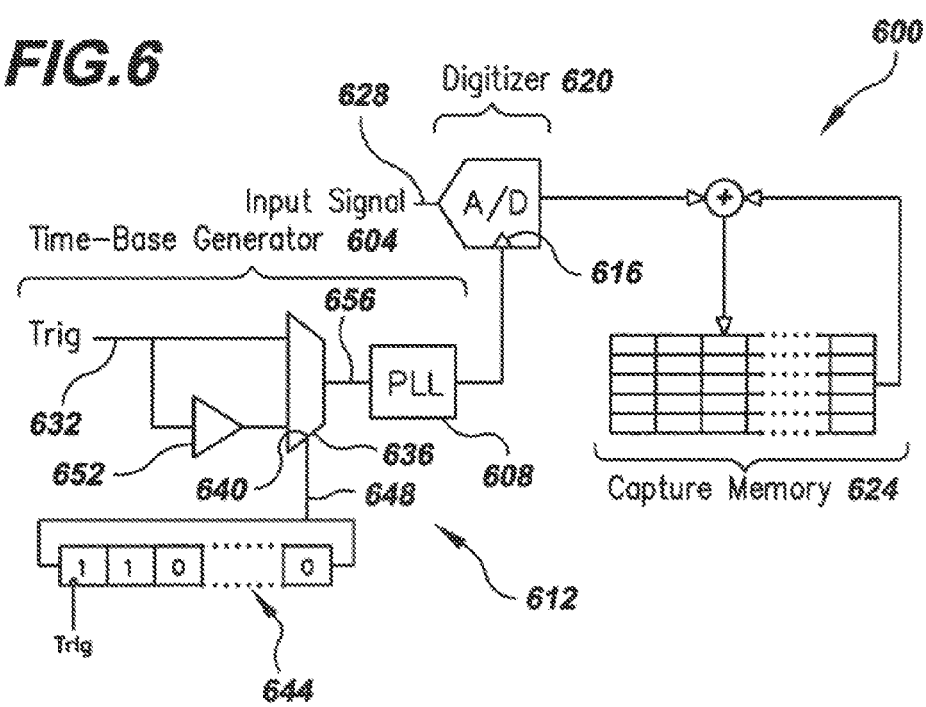
FIG. 6 is a high-level schematic diagram of a signal-integrity measurement system of the present disclosure.

Referring now to the drawings, FIG. 6 illustrates an example 600 of a signal-integrity measurement system made in accordance with the present invention. At a high level, signal-integrity measurement system 600 includes a unique time-base generator 604 comprising a phase filter, in this example a phase-locked loop (PLL) 608, having modulation circuitry 612 at its input. Time-base generator 604 drive a sampling-trigger input 616 of a sampler (here, a digitizer 620). In this example, signal-integrity measurement system 600 includes a capture memory 624 for storing the sampled values of a signal under test (SUT) 628 output by digitizer 620. Not illustrated in FIG. 6, but will be apparent to those skilled in the art, are processing algorithms that are applied to the various memory segments in the system.

The input to time-base generator 604 is a clock signal Trig 632 whose frequency will typically, though not necessarily, be chosen to match the maximum frequency tolerable by the sampling element(s) present. As mentioned earlier, this frequency is likely, though not necessarily, to be lower than the frequency of signal(s) being measured. A time-base generator of the present disclosure, such as time-base generator 604 of FIG. 6, creates the desired sub-sampling delays of this input clock signal (clock signal Trig 632) by modulating the input to the phase filter (PLL 608).

Specifically, and referring to exemplary time-base generator 604 of FIG. 6 for ease of description, a rapidly varying phase signal (timing perturbation signal) is impressed on input clock signal Trig 632 using a suitable circuitry, such as a multiplexer (MUX) 636 having its select input 640 driven by a high-speed modulator, in this example a circular memory 644 clocked by clock signal Trig 632 and containing the digital output signal of a one-bit sigma-delta modulator (not shown), that provides a high-speed phase selection signal 648. In this example, MUX 636 has as its selectable inputs clock signal Trig 632 and a delayed version of clock signal Trig 632 delayed via a fixed delay 652. During operation, the contents of circular memory 644 drive select input 640 of MUX 636 so as to continually select between clock signal Trig 632 and the phase-delayed version of the clock signal so as that the MUX outputs a rapidly varying phase signal 656.

Rapidly varying phase signal 656 is designed to contain various frequency components, as will be described shortly. When the combined signal (clock with phase perturbation) of phase signal 656 is applied to PLL 608, the high frequency phase components are filtered by the PLL, and only the desired sub-sampling delay signal is present in the output. An important benefit of the disclosed embodiments is that fixed coarse delay element 652 does not need to be small. Coarse delay is defined as any delay that is substantially larger than the minimum delay that can be reliably constructed using conventional technology. Typically, such minimum delay is equivalent to minimum bit period attainable in a high speed communications device. In any case, the larger is the delay of delay element 652 is, the larger the delay range that can be programmed and the more robustness to process variations. With this time-base generator circuitry, achieving the fine delay generation is done in the algorithmic step of phase signal selection and is not dependent on or limited by the hardware implementation. Contrast this to analog delay lines and analog phase interpolators, which are widely used in the industry. Most importantly, the jitter at the output of time-base generator 604 is no more than just the jitter of PLL 608 itself and is independent of the time-base generation operation. As mentioned earlier, conventional active delay line and phase interpolator systems add jitter over and above the baseline jitter that exists on the reference clock signal (which likely comes from a PLL anyway).

As mentioned, in this example the contents of circular memory 644 are chosen according to sigma-delta modulation. For example, a one-bit sigma-delta modulator (not shown) may be simulated in software for the purpose of generating phase selection signal 648. The input to the sigma-delta modulator is the desired phase modulation signal that is targeted. As described below, this input could be a DC signal (e.g., delay smaller than finest delay of the technology) or a constant ramp signal. When the modulator is simulated in software, it generates a 1-bit output waveform that contains the original input signal as well as unwanted high-frequency quantization noise. By matching the bandwidth of the sigma-delta modulator to the bandwidth of PLL 608, the unwanted high-frequency quantization noise is guaranteed to be located in the stop-band of the PLL and is not propagated. Other examples of the creation of the phase selection signal will be described shortly. Also, it is important to note that the use of PLL 608 is only exemplary. Any phase filtering circuit, such as a delay-locked loop, can be used. As another example, phase averaging using resistor strings (like in analog phase interpolators) can be used.

Beyond time-base generator 604, the sampler (in this example, digitizer 620) can take on any one of several forms. For the purposes of this section, digitizer 620 is an A/D converter. It should be evident to those skilled in the art that the circuitry of digitizer 620 could look like a conventional digitizer. In subsequent sections, examples of different compact implementations of the sampler are described that allow it to be deployed in built-in self-test applications. Examples of measurement algorithms associated with these measurement macros are also described below.

2.0 Time-Base Generation—General Purpose

Figure 7:
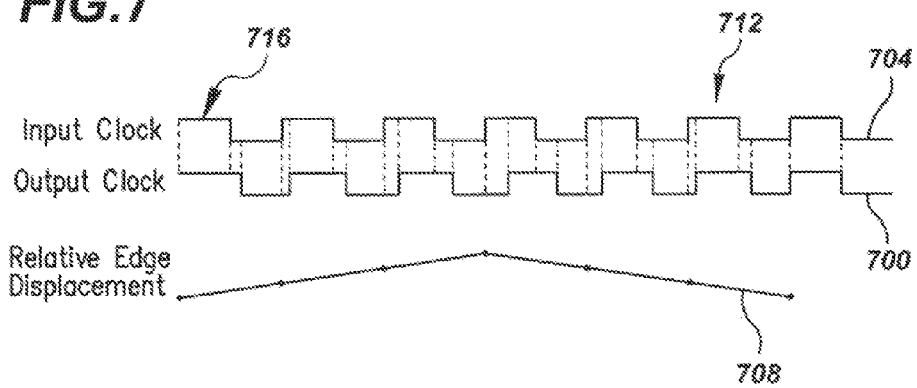
FIG. 7 is a timing diagram illustrating a principle of operation of the time-base generator of FIG. 6.

Referring still to FIG. 6, the purpose of time-base generator 604 is to place the sampling instants of digitizer 620 in a controlled manner, as shown, for example, in FIG. 7. FIG. 7 illustrates how the output clock signal 700 (corresponds to sampling-trigger input 616 in FIG. 6) of time-base generator 604 is delayed slowly in a linear fashion with respect to the input clock signal 704, as represented by the plot 708 of the relative edge displacements between input and output clock signals 704, 700, respectively. This section describes how time-base generator 604 can accomplish this.

The output phase of a PLL can be expressed in terms of its input phase as $$\frac{\phi_{out}(j\omega)}{\phi_{in}(j\omega)} = \frac{b_1 j\omega + b_0}{a_3(j\omega)^3 + a_2(j\omega)^2 + a_1(j\omega)^1 + a_0} \quad \{1\}$$

where $b_i$ and $a_i$ are design-dependent coefficients and where a third-order PLL is assumed. Generally, this phase transfer function is a low-pass function, which means that the output phase of the PLL will track the input phase quite well as long as it remains within the PLL's designed bandwidth. Using Equation $\{1\}$, the behavior of FIG. 7 can be achieved by modulating the input of the PLL, for example, using one-bit sigma-delta modulation in the phase domain.

Figure 8:
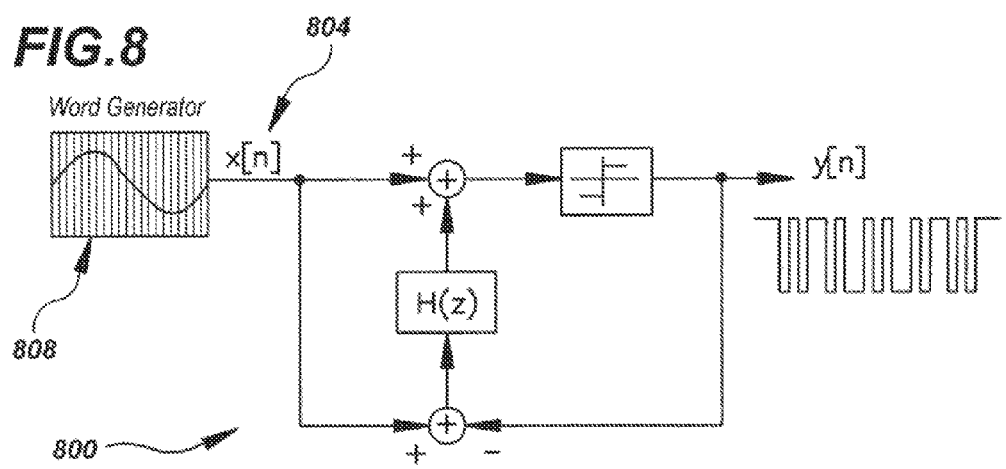
FIG. 8 is a block diagram of a sigma-delta modulator, suitable for use with time-base generator of FIG. 6, that generates a one-bit signal from an infinite precision signal.

FIG. 8 illustrates an exemplary one-bit sigma-delta modulator 800, which is a system that takes a potentially infinite precision quantity and converts it into a one-bit representation. Physically reducing an infinite-precision quantity to a one-bit representation results in severe quantization or round-off error. A sigma-delta modulator, such as sigma-delta modulator 800 of FIG. 8, shapes away the round-off error and confines it in certain bands in the frequency domain. If the signal being modulated is confined to a frequency band other than the round-off error band, it remains preserved. This is illustrated in the plot 900 of FIG. 9 in which a sine wave (apparent as a spike 904 in the plot) is encoded by the sigma-delta modulation operation in the low-frequency band and the round-off error is encoded in the high-frequency band. The figure plots the frequency spectrum of the one-bit representation produced by the modulator and shows how the one-bit representation preserves the original low frequency sine wave. When it comes time to recover the original modulated signal, all that is needed is a frequency-selective filter that removes all the round-off error components. Refer to FIG. 8 again, sigma-delta modulator 800 is practically driven by a word generator memory 808 that contains the desired waveform x[n] 804, being modulated. Since infinite precision is impossible to create in digital system, the word generator stores waveform x[n] 804 with the maximum precision possible, such as 32, 64, or 128 bit depending on the digital computer architecture available.

Figure 10:
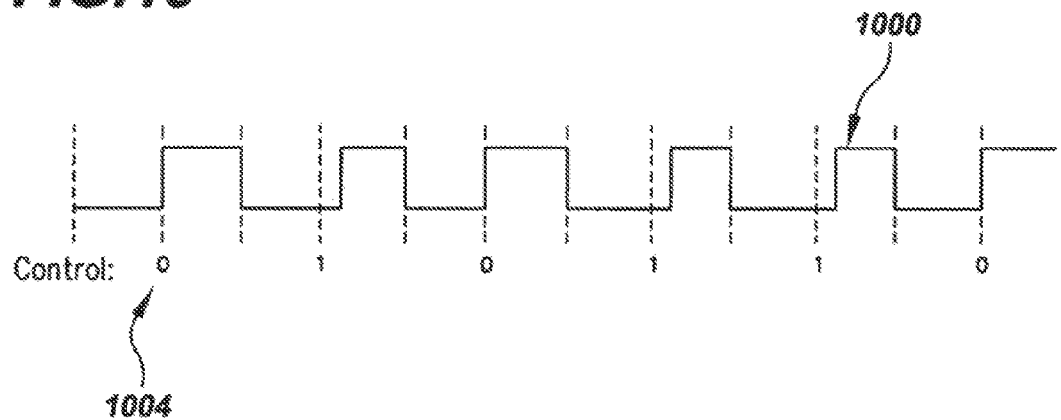
FIG. 10 is a diagram illustrating an input signal to the phase-locked loop (PLL) of the time-base generator of FIG. 6.

Referring again to FIG. 6, when making a one-bit sigma-delta modulated "phase" waveform available at the input of a PLL, such as PLL 608 of FIG. 6, the output "phase" of the PLL will preserve the original encoded phase signal quite well. The combination of delay element 652 and multiplexer 636 creates this input one-bit sigma-delta modulated "phase" waveform. In particular, this circuit essentially rapidly delays or advances the phase of the input clock signal to PLL 608 as illustrated by the composite signal 1000 in FIG. 10 that shows the advance or delay the clock signal Trig 632 input into PLL 608 (FIG. 6). It should be evident that composite signal 1000 in FIG. 10 corresponds to signal 656 in FIG. 6. Also, control sequence 1004 in FIG. 10 corresponds to signal 648 in FIG. 6. Thus, from a phase point of view, PLL 608 sees a rapidly switching one-bit signal. It responds by filtering this one-bit signal to create an output phase signal that looks like the original waveform function x[n] 804 in FIG. 8. It is noted that delay element 652 of FIG. 6 can be designed to have a programmable delay value to allow for different delay range configuration off-line. The only requirement is that a fixed delay is used when the time-base generator is operational.

One example of the generation of the phase selection signal (corresponding to phase selection signal 648 of FIG. 6) is to construct an entire sigma-delta modulator in hardware (not shown, although identical at a high level to sigma-delta modulator 800 in FIG. 8). In another example (which is represented in FIG. 6), a sigma-delta modulator is simulated in software and its output is stored in circular memory 644 of FIG. 6. A description of the simulation of a sigma-delta modulator may be found in U.S. Pat. No. 6,931,579, which is incorporated herein by reference for its pertinent disclosure. In yet another embodiment, a first-order pulse-density modulation (PDM) converter (not shown) can be used. A PDM converter is a digital circuit that converts a parallel word (e.g. 16 bits) from, say, a word generator, into a serial stream; the value of the digital word is encoded in the density of the output serial stream. The operation of a PDM converter is known to those versed in the art. Alternatively, a PWM counter (not shown) can be used.

In addition, it is noted that although a one-bit sigma-delta modulator has been described, a multi-bit sigma-delta modulator and multi-bit circular memory can be used. If, for example, a two bit sigma-delta modulator or a two-bit circular memory containing software-generated sigma-delta modulated streams is used, a two-bit multiplexer may be used to select from among four differently delayed (including a delay of zero) clock signals in a manner similar to multiplexer 636 selecting between the two differently delayed signals in FIG. 6. The advantage of a multi-bit approach is more delay range; the disadvantage is more circuit complexity.

Returning to the time-base generation, in one example of time-base generator 604, phase selection signal 648 is used to encode a ramp waveform. Specifically, waveform function x[n] 804 in FIG. 8 is an ideal near infinite-precision ramp signal. An important point to note about time-base generator 604 is that the edge placement of output clock signal 700 (FIG. 7) with respect to input clock signal 704 is deterministic. No matter how long this time-base generator 604 (FIG. 6) is run, the phase relationship between input clock signal 704 and output clock signal 700 will always be the same. Notice, for example, how the phase for the last clock cycle 712 in FIG. 7 has the same value as that for the first cycle 716. Time-base generator 608 (FIG. 6) does not suffer from drift and wander issues associated with offset-frequency oscillators.

Figure 3:
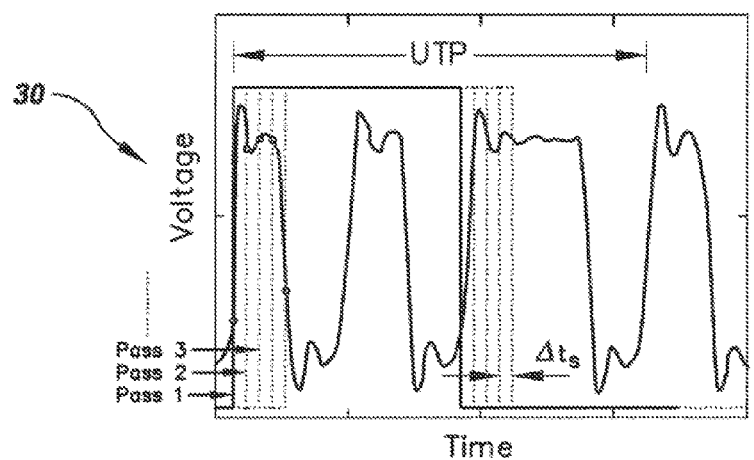
FIG. 3 is a graph illustrating a conventional delayed-clock sub-sampling scheme for digitizing an analog signal.
Figure 4:
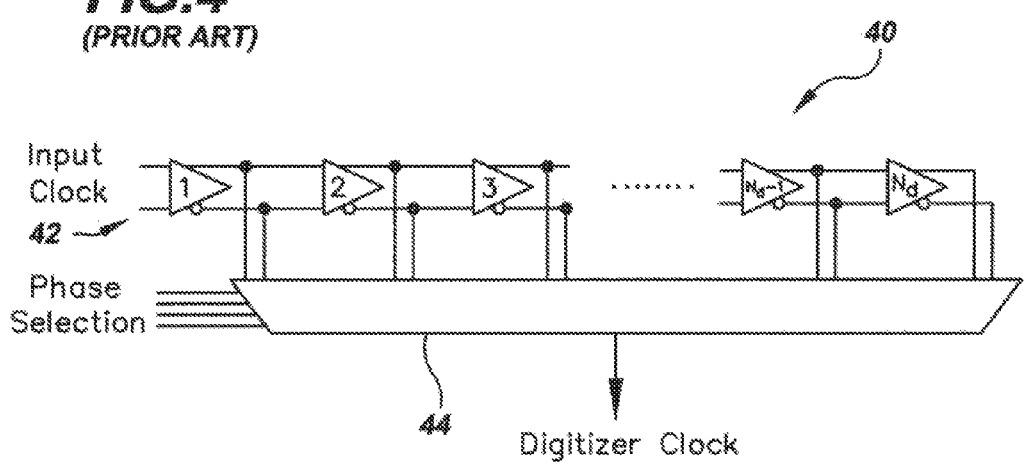
FIG. 4 is a high-level schematic diagram of conventional multi-inverter circuitry for implementing the delayed-clock sub-sampling scheme of FIG. 3.
Figure 5:
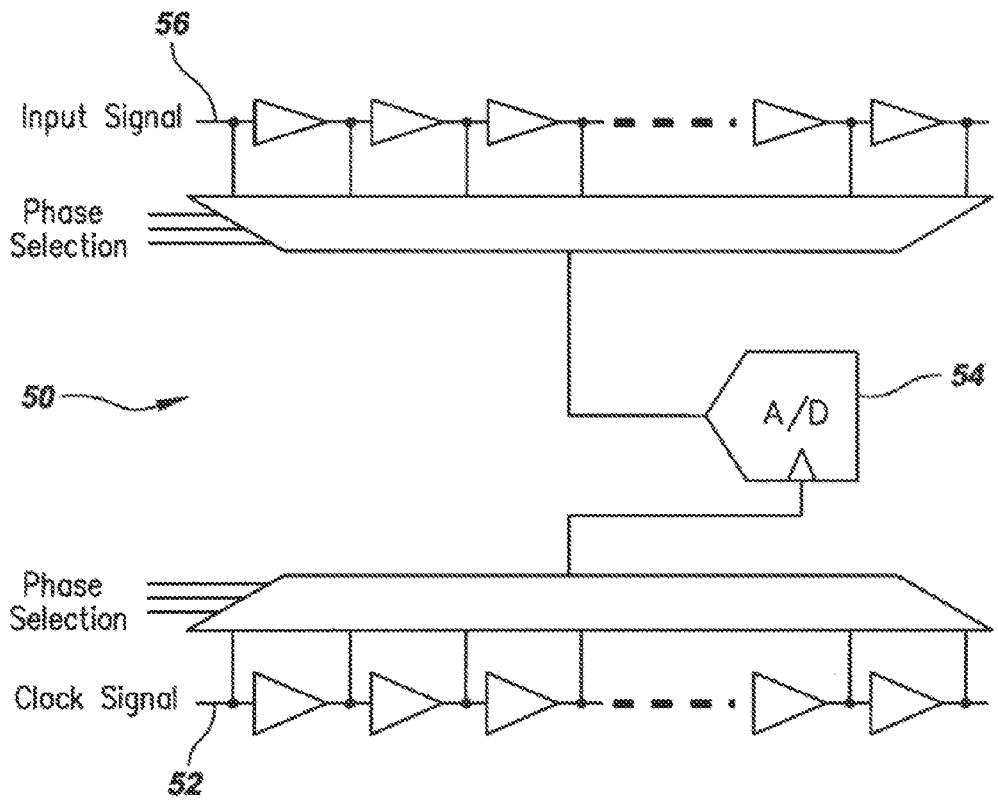
FIG. 5 is a high-level schematic diagram of conventional vernier delay-line measurement circuitry.

The deterministic nature of output clock signal 700 relative to input clock signal 704 in FIG. 7 is an important benefit of a signal integrity measurement system, such as system 600 of FIG. 6, made in accordance with the present disclosure. Much like the delayed-clock sub-sampling algorithm described in connection with FIG. 3, the output of a time-base generator of the present disclosure, such as time-base generator 604 of FIG. 6, can trace the horizontal axis with very fine and deterministic sampling instants while requiring hardly any additional invention-specific hardware; and it does this as it is ramping up and down. The period with which the time-base generator sweeps back and forth is typically a function of the length of, in this example, circular memory 644 (FIG. 6) as well as its content. The repetition frequency of the ramp, Ft, is given by $$F_t = \frac{M}{N} F_S \quad \{2\}$$

where $F_S$ is the frequency of input clock signal Trig 632 of system 600, N is the length of the 1-bit memory and M is the number of repetitions of the ramp signal, x[n], within every N cycles. Consider the simplest example of M=1. In this example, the output of time-base generator 604 ramps up and down in the duration it takes to cycle through one whole length of the periodic memory. Thus, the ramp repeats every N cycles of input clock signal Trig 632.

Figure 11:
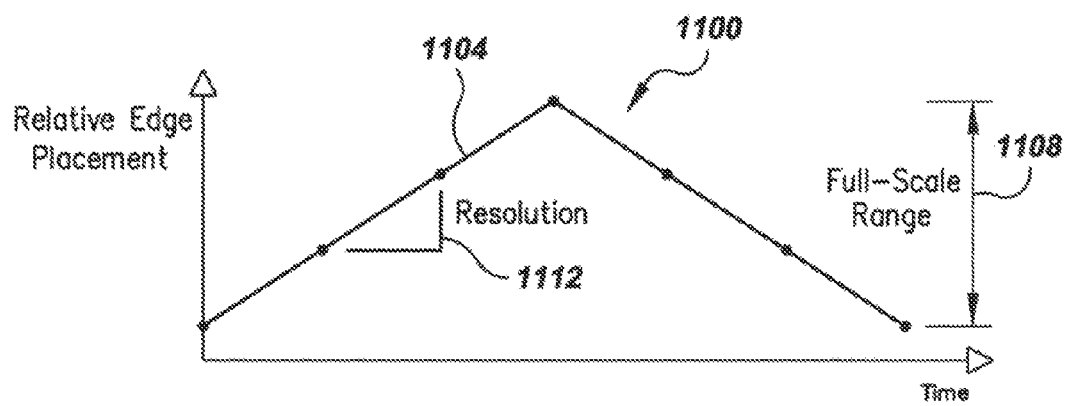
FIG. 11 is a graph of relative signal edge placement versus time illustrating a relationship between ramp duration, full-scale range and resolution.

To help determine M, we need to consider the target resolution and range for the time-base generator. Referring to the plot 1100 of FIG. 11 that shows an exemplary ramp signal 1104, the range 1108 of the ramp signal is determined by the full-scale delay introduced at the input of PLL 608 (FIG. 6) (i.e., coarse delay element 652). This could be as large as is necessary, although the bigger it is, the larger the in-band quantization noise of the sigma-delta modulated bit streams. As was mentioned before, delay element 652 could be programmable to trade between full-scale delay and quantization noise. Similarly, and also referring to FIG. 11, resolution 1112 of ramp signal 1104, and thus, time-base generator 604 (FIG. 6), is equal to the programmed height of the ramp signal divided by its length. For example, if the full-scale delay is 500 psec, the length of the bit stream is 1000 bits long, and if the ramp spans the whole 1000 bits, then the maximum resolution of time-base generator in this example is 0.5 psec. We can use this example further to point out three different ways for programming resolution:

1) Keep encoding a fixed ramp signal as per the above example and achieve a coarser resolution by skipping cycles. Specifically, strobing every other cycle at the output of the PLL in the above example achieves a resolution of 1 psec instead of 0.5 psec.
2) Keep encoding a fixed ramp signal as per the above example and increase the memory length. Increasing the memory length in the above example to 2000 bits long results in a resolution of 0.25 psec.
3) Encode multiple ramp periods within a single memory. Specifically, if M=2 in the above example, this means that two ramps are encoded in the 1000 bit long memory, and a resolution of 1 psec is achieved; intuitively, the ramps have to rise and fall twice as fast in order to fit within the same 1000-bit long duration, so their slopes are steeper.

Strictly speaking, one can in principle change M without changing the target resolution, but this is beyond the scope of this section. In a nutshell, this is achieved by following coherent sampling requirements that are well known in the mixed-signal test industry. For reference, the reader is pointed to section 5.2 herein and M. Burns and G. W. Roberts, *An Introduction to Mixed-Signal IC Test and Measurement*, Oxford University Press, New York, 2001, which is incorporated herein by reference for its pertinent disclosure.

Figure 9:
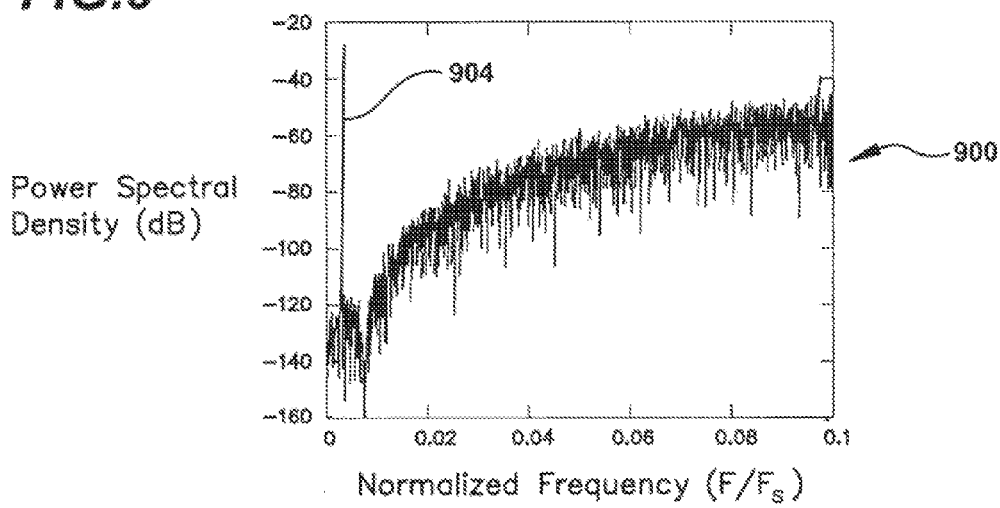
FIG. 9 is a graph of an exemplary frequency spectrum of the output of the sigma-delta modulator of FIG. 8.

FIG. 12 illustrates a flow diagram 1200 of how a time-base generator, such as time-base generator 604 of FIG. 6 can be designed and operated. In this example, there is a hardware component and a software component to the steps illustrated in flow diagram 1200. The hardware component is represented in FIG. 6, and the software component is represented in FIGS. 8 and 9, as well as in the preceding text.

At step 1205, a target sampling frequency of signal-integrity measurement system 600 is determined. At step 1210, a reasonable bandwidth of PLL 608 is determined. This is potentially determined by the target application. For example, if the test system is intended to comply to a certain standard such as PCI Express, the specifications of the standards community will drive the bandwidth of the PLL. In the absence of specific needs, for stability concerns, this bandwidth should be taken as less than one-tenth of the sampling frequency determined in step 1205. At step 1215, a sigma-delta modulator (here, implemented in software), such as one-bit sigma-delta modulator 800 of FIG. 8, is designed to match the frequency response of PLL 608. At step 1220, determine the ramp waveform to be simulated using target resolution, range, test time and sampling frequency. Once an appropriate ramp waveform has been determined, it is placed in word generator 808 in FIG. 8, and at step 1225 the sigma-delta modulator is run using the ramp waveform and the output one-bit representation is analyzed for accuracy. Specifically, sigma-delta modulator 800 in FIG. 8 is generally chaotic and has an infinite duration response. In this example, only a finite sequence of length N out of the modulator is required and stored in circular memory 644. Before this sequence is stored in said memory, its accuracy needs to be verified. This may be achieved by performing a FFT on the selected sequence and observing the frequency spectrum. A spectrum such as plot 900 in FIG. 9 will be observed. Those versed in the art will understand how to analyze this spectrum. Alternatively, a software simulation of the selected one-bit sequence is performed to verify that it will work well when it is stored in circular memory 644. It should be understood that an iterative procedure to select the best N bits for use in signal-integrity system 600 may be required (step 1230). Once the one-bit sequence is stored in circular memory 644 in this example, signal-integrity measurement system 600 can be operated to perform tests on real signals.

3.0 Time-Base Generation—Fixed Delay

In addition to ramp generation, for example, as per flow diagram 1200 of FIG. 12, another embodiment of the present disclosure involves creating a fixed strobe delay out of time-base generator 604 (FIG. 6). This is particularly useful in bit-error-rate applications and in clock-testing applications. For the purpose of creating fixed strobe delays in the proposed time-base generator, the only necessary difference in flow diagram 1200 of FIG. 12 is to replace the ramp signal in the sigma-delta modulation step (i.e., step 1225) with a DC signal. Specifically, x[n] 804 in FIG. 8 is now a constant signal as opposed to a ramp signal. The stability requirements for a sigma-delta modulator driven by a DC signal are understood in the art and need to be respected. Apart from sigma-delta modulation, the DC signal can be encoded using a PDM counter, a PWM counter or even a linear feedback shift register.

4.0 Sampler Design

So far, the sampler (digitizer 620) has been represented as an A/D converter in FIG. 6. This section introduces three variants of sampler design with varying levels of complexity. Referring to FIG. 13, a simple sampler design, and the one presently most preferred for implementation in signal-integrity measurement macros for built-in self-test, is a D-flip-flop (D-FF), illustrated in FIG. 13 at element numeral 1300. Such a circuit can be thought of as a zero-crossing detector. If the clock input 1304 of D-FF 1300 arrives when the SUT input 1308 is higher than the internal switching threshold of the flip-flop, a logical "1" is sampled; if the clock input arrives when the SUT input is lower than the flip-flop's switching threshold, a logical "0" is sampled. When combined with a time-base generator of the present disclosure, such as time-base generator 604 of FIG. 6 (e.g., as a replacement for digitizer 620), D-FF 1300 can be used to measure the timing of occurrence of various signals. Referring to FIG. 13, consider the case when the time of arrival of a signal is sought. The time-base generator ramps (i.e. delays) the sampling clock of D-FF 1300 slowly, as represented by Ramp Cycles i−3 through i+1, and the D-FF samples the incoming SUT at input 1308. The output of D-FF 1300 will transition when the time-base generator output starts to lag the SUT being measured. Thus, knowing when the output of D-FF 1300 transitions, and knowing the phase of the time-base generator, one can determine the time of arrival of the SUT.

In stricter terms, D-FF 1300 essentially samples the likelihood that its D-input signal, here, the SUT at input 1308) has arrived before its clock-input signal, here the output of the time-base generator, such as time-base generator 604 of FIG. 6. By sweeping the clock input using the time-base generator, D-FF 1300 can be used to construct the cumulative distribution function of the arrival time of the signal under test. In the absence of noise or jitter, such as illustrated in FIG. 13, this cumulative distribution function is a step function. In the presence of noise or jitter, some input signal transitions will occur earlier than nominal and others will occur later. The output of D-FF 1300 for each ramp cycle of the time-base generator will look like the output signal segments 1400, 1404 of FIG. 14.

Figure 1A:
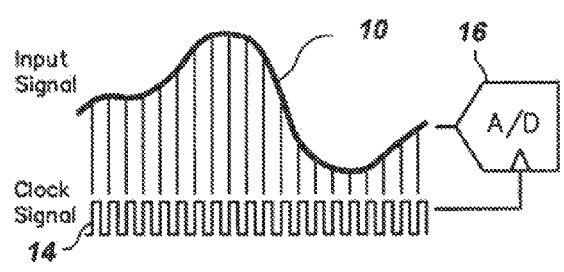
FIG. 1A is a diagram illustrating the digitization of an analog waveform by an analog-to-digital (A/D) converter.
Figure 1B:
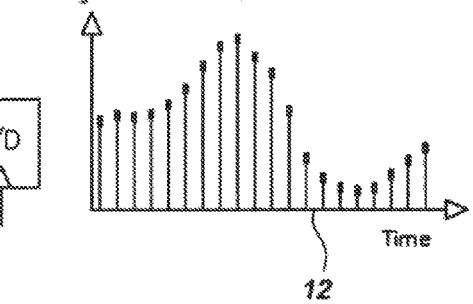
FIG. 1B is a graph of the digitized waveform of the analog waveform of FIG. 1A.
Figure 2:
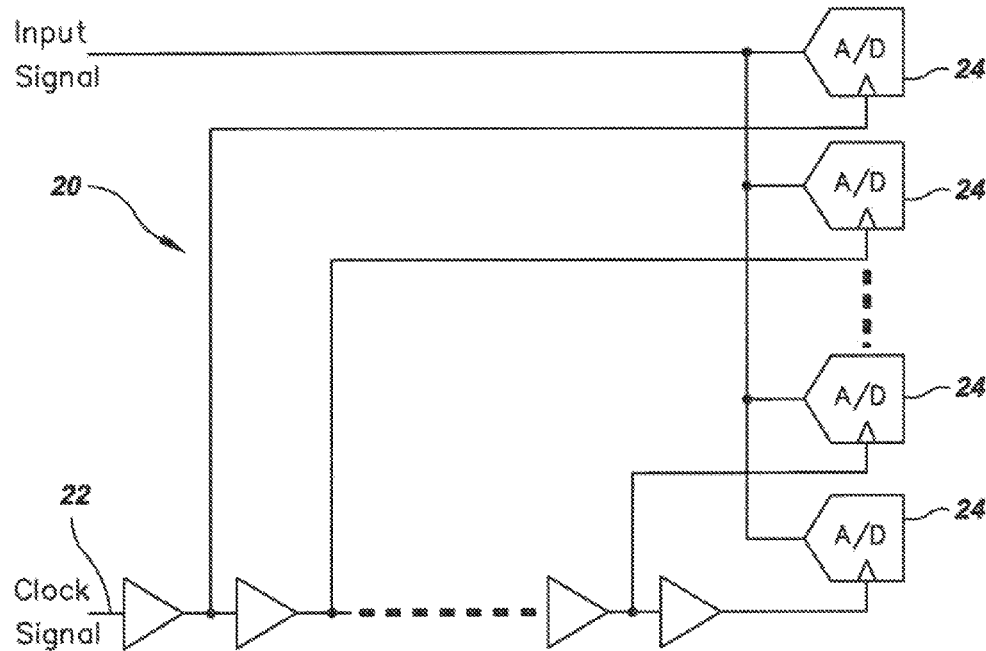
FIG. 2 is a high-level schematic diagram of a typical time-interleaved A/D converter architecture suitable for use in a real-time oscilloscope.
Figure 14:
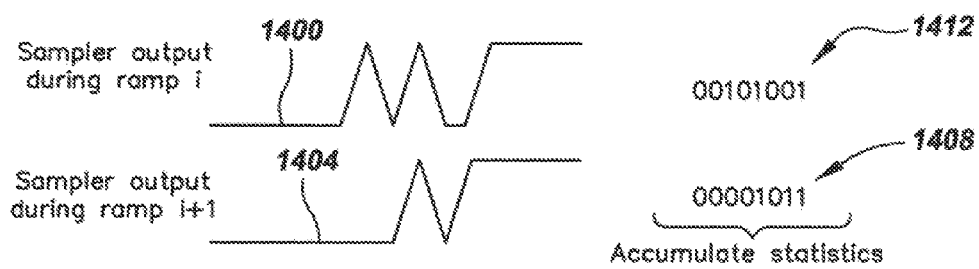
FIG. 14 is a diagram illustrating importance of synchronizing ramps for proper statistical calculations.

The output of D-FF 1300 can be stored neatly in a capture memory, such as capture memory 624 conceptually illustrated in FIG. 6. If the outputs of D-FF 1300 are properly accumulated in separate capture memory locations, an accurate cumulative distribution function of the timing of the signal under test at input 1308 can be plotted. By "properly accumulated," it is meant that the second sequence 1408 of samples in FIG. 14 is accumulated to the exact same memory locations as for the corresponding sequence 1412 in the first run. The reason is that each memory location now corresponds to a phase value of the sampling clock; each memory location is a point on the x-axis of FIG. 1. By storing each digitization cycle (which corresponds to a ramp cycle) to the same memory locations, drift or wander issues do not influence the results. This is a reason the deterministic nature of a time-base generator of the present disclosure, such as time-base generator 604 of FIG. 6, is so beneficial.

Figure 15:
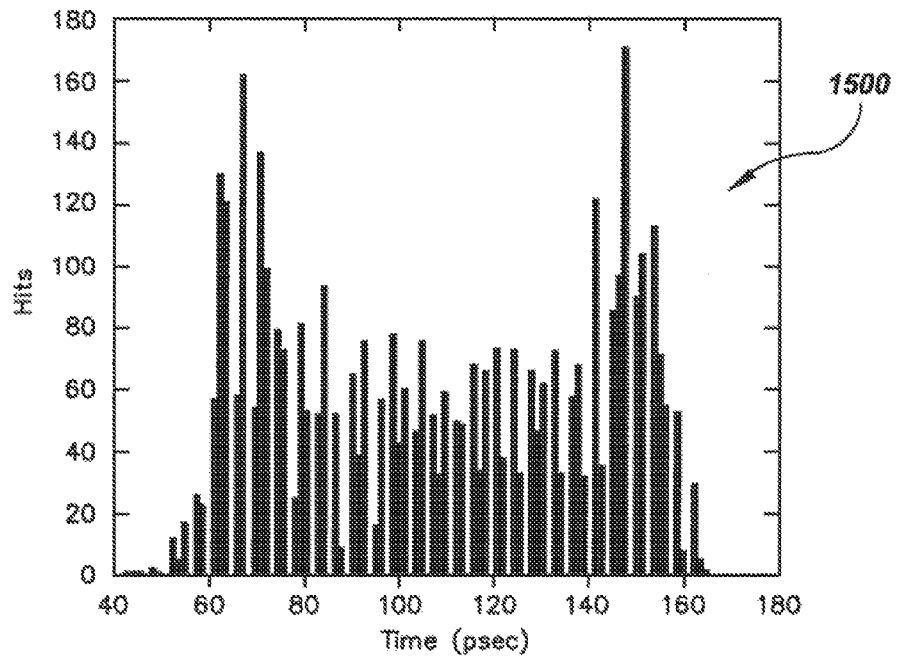
FIG. 15 is a graph of hits versus time that results from coupling a time-base generator of the present disclosure to the sampling D-flip-flop of FIG. 13 and computing jitter statistics on a signal under test.

Once the sum of all ramp cycle results is accumulated in the capture memory, one can obtain statistics on the time of arrival of the signal under test. For example, we can differentiate the contents of the capture memory (the cumulative distribution function) to obtain a histogram or a probability density function of the jitter on the signal under test. An example of a histogram 1500 that is obtained using this method is shown in FIG. 15. Further description of the translation of the output of D-FF 1300 into jitter histograms is omitted from this section. However, such description can be found in M. Hafed, N. Abaskharoun, G. W. Roberts, "A Stand-Alone Integrated Test Core for Time and Frequency Domain Measurements," *Proc. IEEE ITC*, pp. 1031-1040, 2000 and N. Abaskharoun, M. Hafed, G. W. Roberts, "Strategies for On-Chip Sub-Nanosecond Signal Capture and Timing Measurements," *Proc. IEEE ISCAS*, pp. 174-177, 2001, which are incorporated herein by reference in their entireties. Where appropriate in the following sections, specific original aspects of the statistics computations for certain embodiments of the present disclosure are pointed out with particularity.

Figure 16:
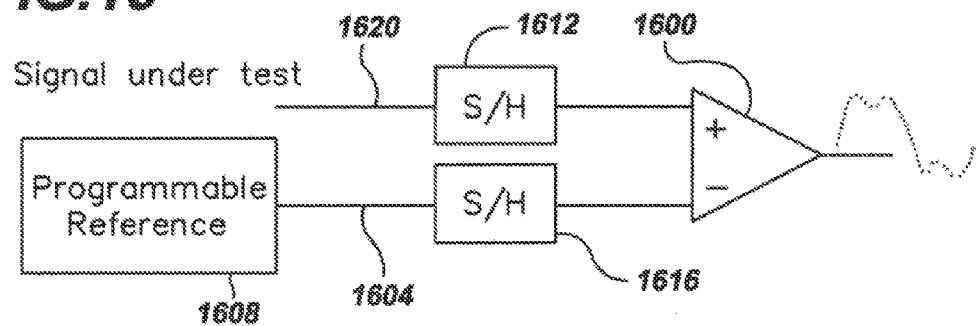
FIG. 16 is a high-level schematic diagram of an arbitrary-resolution voltage digitizer for sweeping the voltage axis of a signal under test in a manner similar to a time-base generator sweeping the time axis of the signal under test.

Performing the sampling operation using a D-FF allows for the measurement of the timing of signals. For example, it allows the measurement of jitter on a high-speed digital signal or on a clock signal. Beyond measuring timing, some test applications require the digitization of complete waveforms in order to determine AC quantities such as rise-time, fall-time, overshoot, maximum voltage or minimum voltage. For such applications, a second variant of the sampler, i.e., a comparator (which is illustrated at element numeral 1600 of FIG. 16), can be used. As seen in FIG. 16, comparator 1600 can be combined with a variable reference voltage 1604, provided, for example by a programmable reference 1608, to create an arbitrary-resolution voltage digitizer. The sample-and-hold circuits 1612, 1616 represented in FIG. 16 may be located in the circuitry of comparator 1600 itself and does not need to be implemented explicitly.

A comparator, such as comparator 1600 can be operated in two ways when connected to a time-base generator of the present disclosure, for example, time-base generator 604 of FIG. 6. In this case, comparator 1600 may replace digitizer 620 or may otherwise be connected to the output of time-base generator 604. First, time-base generator 604 can be disabled or programmed to generate a fixed sampling offset. Then, over multiple runs of a repetitive input signal under test 1620 (corresponds to signal 628 of FIG. 6), reference input voltage 1604 can be swept to comparator 1600 and a thermometer code representation of the voltage waveform being measured can be progressively constructed. For example, if the 20% to 80% rise-time is sought, reference input voltage 1604 to comparator 1600 can be placed at the 20% level, and the time signal under test 1620 crosses this level recorded. Subsequently, reference input voltage 1604 is placed at the 80% level and the time signal under test 1620 crosses this level is recorded. The rise-time is then the difference between the two values. When a fine timing resolution is required, time-base generator 604 is enabled to ramp its output. So, in a nutshell, both the time axis and the voltage axis are gradually swept in order to digitize signal under test 1600. The digitization method using a single comparator and an efficient programmable reference is described in U.S. Pat. No. 6,931,579, which is incorporated by reference herein for its pertinent disclosure.

A benefit of this variant is that it allows the complete digitization of AC parameters of waveforms (instead of just timing or jitter) while not taking much more area than a D-FF implementation. As a third variant, any A/D converter topology can be deployed. In general, this approach is not desired when constructing an on-chip measurement macro based on this technology, but it can be used if a stand-alone measurement instrument is created. The assumption is that the area constraints are less stringent in the stand-alone instrument scenario.

5.0 Sample Capture and DSP Embodiments

In this section, differing DSP embodiments are disclosed for the application of a measurement system of the present disclosure in various test and measurement applications.

5.1 Clock Jitter and AC Parameter Measurement

This section considers the problem of digitizing and analyzing jitter of clock waveforms. The clock waveforms could be internal to, for example, an ASIC or FPGA, or they could be the outputs of various clock chips, such as clock generators, fanout buffers, and zero-delay buffers. First considered is the case in which the frequency of the clock signal being measured is equal to the clock frequency of the time-base generator. This is a straightforward deployment of a time-base generator of the present disclosure.

Figure 17:
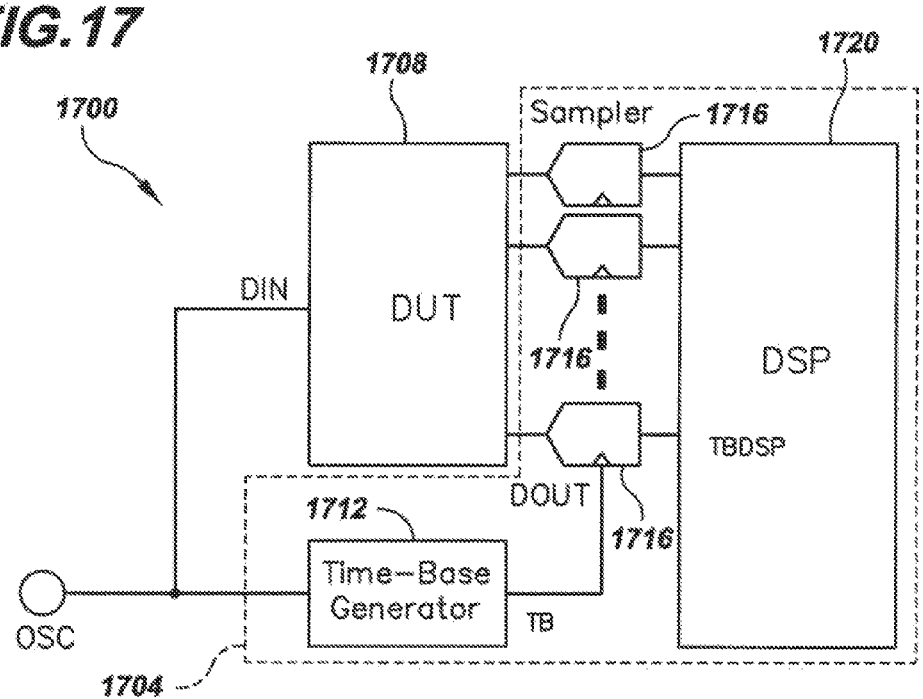
FIG. 17 is a high-level schematic diagram of an alternative signal-integrity measurement system of the present disclosure.

FIG. 17 illustrates and exemplary deployment 1700 in which a signal-integrity measurement system 1704 is applied to a multi-channel device under test (DUT) 1708. In FIG. 17, the frequency of clock signal DIN is the frequency at the input of DUT 1708, the frequency of clock signal DOUT is the frequency at the output of the DUT, the frequency of clock signal TB is the frequency of the output of the time-base generator 1712, and the frequency of clock signal TBDSP is the frequency at which the outputs of samplers 1716 outputs are clocked and analyzed by a digital signal processor (DSP) 1720.

Figure 18:
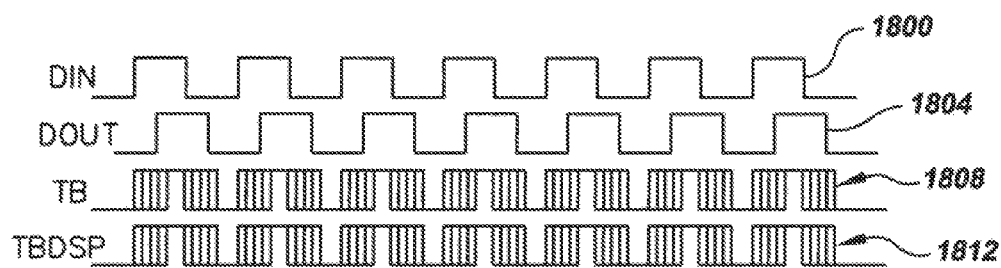
FIG. 18 is a timing diagram of the signal integrity measurement system of FIG. 17 for a case of the device-under-test (DUT) frequency equaling the time-base generator (sampling) frequency.

When the frequencies of signal DOUT at the output of DUT 1708 and signal TB of the output of time-base generator 1712 are the same value, as illustrated in FIG. 17, the various waveforms corresponding to clock signals DIN, DOUT, TB, TBDSP will look like, respectively, waveforms 1800, 1804, 1808, 1812 of FIG. 18. Referring to FIG. 18, multiple bands for clock signals TB and TBDSP are used to illustrate the sweeping action of time-base generator 1712. The previous explanation of a time-base generator of the present disclosure applies to waveforms 1800, 1804, 1808, 1812 of FIG. 18. That is, every new clock cycle out of time-base generator 1712 (FIG. 17) corresponds to an increment in the x-axis of the final digitized waveform, and the increment corresponds to the resolution calculation that was performed in Section 2.0, above.

Figure 19:
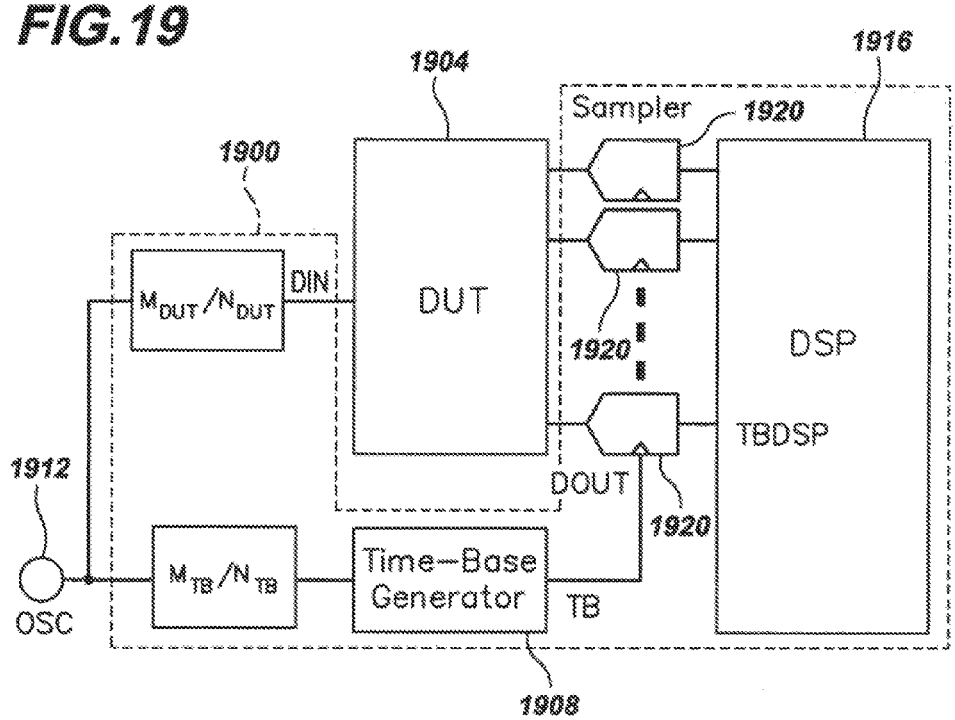
FIG. 19 is a high-level schematic diagram of a signal-integrity measurement system of the present disclosure in which the DUT and sampling frequencies differ from one another.

In general, it may be desired to measure clock frequencies that are not necessarily equal to the frequency of clock signal TB at the output of time-base generator 1712. This can be achieved in a signal-integrity measurement system of the present disclosure and can be explained within the context of FIG. 19, which illustrates an alternative signal-integrity measurement system 1900. Referring to FIG. 19, it is seen that the frequencies of the clock signals DOUT, TB at, respectively, the outputs of the DUT 1904 and the time-base generator 1908 are both derived from the frequency of a common oscillator 1912. This is generally not an unreasonable assumption for most clocking applications. Specifically, it is assumed that $$TB = \frac{M_{TB}}{N_{TB}} F_{OSC} \quad \{3\}$$

and $$DOUT = \frac{M_{DUT}}{N_{DUT}} F_{OSC} \quad \{4\}$$

wherein M and N are integers denoting the rational relationship between the frequency of the corresponding component (either DUT 1904 or time-base generator 1908) and Fosc is the frequency of oscillator 1912. It can be shown that the frequencies TB and DOUT of clock signals TB, DOUT will meet at deterministic multiples of each signal's periods. Specifically, their intersection will depend on $N_{TB}$ and $N_{DUT}$ of the least rational numbers of Equations {3} and {4}.

By way of example, consider a situation in which DOUT=102/33 $F_{OSC}$ and TB=5/4 $F_{OSC}$. We first represent DOUT as 34/11 times the frequency of oscillator 1912. Then, the least common multiple of 11 and 4 is 44. The outputs will align every 11*5 cycles of clock signal TB or 34*4 cycles of clock signal DOUT. Since we sample the output of time-base generator 1908 using clock signal TBDSP, the latter needs to have a period of 11*5 times the period of clock signal TB. This sampling rate of the DSP 1916 ensures that the output of time-base generator 1908 is only used to sample the signal under test coherently.

The above analysis indicates that the frequency of clock signal TBDSP can be different from clock signal TB for multiple-frequency applications. Specifically, in the above example, the frequency of clock signal TBDSP is 55 times slower than the frequency of clock signal TB. Since it is still desired to sampling each $55^{th}$ edge with a sweeping ramp (to construct jitter histograms or to measure AC parameters), the effects of this "sub-sampling" on the ramp signal itself must be considered. That is, by observing the TB signal every $55^{th}$ edge, there is a risk of not sampling every point on the ramp 708 of FIG. 7. By restating this problem as a classic coherent sampling problem, however, it can be ensured that each point on the ramp is seen by each $55^{th}$ edge of clock signal TB.

Figure 20:
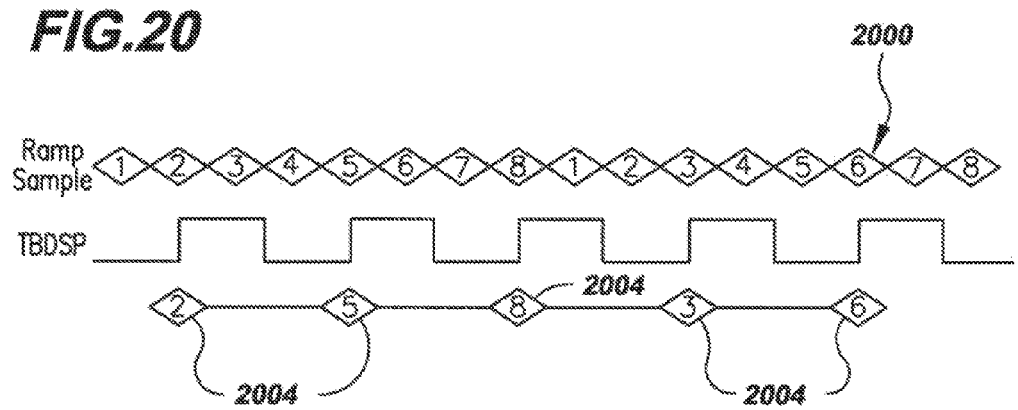
FIG. 20 is a timing diagram illustrating the selection of sampling rate for the TBDSP signal of FIG. 19 to ensure that all ramp delays are exploited.

Consider by way of example the situation illustrated in FIG. 20. In this example, a ramp memory, corresponding to circular memory 644 in FIG. 6, is 8 bits long, and the frequency of clock signal TBDSP (FIG. 20) is three times slower than the frequency of clock signal TB. Every sample 2000 in FIG. 20 in the ramp will be uniquely sampled by clock signal TBDSP to yield DSP samples 2004, albeit it will take three times as long to collect all eight samples. The other implication of this scenario is that ramp samples 2000 are now shuffled as is evidenced by FIG. 20. In general, setting the ratio of the frequency of clock signal TB to the frequency of clock signal TBDSP (3 in this case) to be relatively prime with respect to the length of the ramp memory ensures this coherence in the measurement. If the ramp memory length is even, this ratio can simply be an odd integer, and the converse is true.

Before closing this section, it is noted that the design of samplers 1716, 1920 (FIGS. 17 and 19, respectively) could be, for example, any one of the three variants described above. That is, a D-FF can be used if only jitter is sought, or if the whole clock waveform needs to be digitized, a comparator or A/D converter can be used.

5.2 Jitter Measurement on High-speed Serial Patterns

Jitter measurement on high-speed serial patterns is an important topic that is addressed by embodiments of the present disclosure. In a jitter-measurement application, an arbitrary pattern, such as a pseudo-random bit sequence (PRBS), is being measured as opposed to just a clock. From an implementation point of view, this can be thought of as being very similar to the one just described relative to FIGS. 19 and 20. In particular, it is assumed that the serial pattern being measured is synchronized with the same fundamental oscillator that drives the time-base generator. It is also assumed that the test pattern is repetitive. Both of these assumptions are not unreasonable. Just like the multiple-frequency clock case discussed immediately above, the synchronized and repetitive test pattern may or may not have a transition every time the timing-base generator output clock (TB) or the DSP clocking/analysis clock (TBDSP) toggles. This behavior is deterministic. By controlling when to sample the DSP clocking/analysis clock TBDSP, different transition intervals in the repetitive serial pattern can be walked through and its jitter analyzed.

For example, consider a PRBS pattern that is 127 bits long. This length can be mapped into an equivalent $M_{DUT}$ and $N_{DUT}$ for an equivalent clock frequency. These factors can then be used to sample every $127^{th}$ data beat of the repeating PRBS pattern just like was done for the clock signal in section 5.1, above. Of course, all this time, the statistics of a single "bit" in the PRBS sequence are being sampled. Once jitter statistics for this bit are constructed by sampling it at every iteration of the whole PRBS pattern, the whole observation window can be shifted and the next bit in the pattern sampled. The reason it is desirable to repeat the statistical computation of each "bit" in the PRBS pattern is that, unlike for clock signals, it is often desirable to separate the average edge arrival time for each bit in the pattern from other random jitter components that ride on all edges. Once the statistics for every edge in the repeating test pattern are collected, data-dependent jitter (average arrival time for all edges), as well as random and uncorrelated jitter, can be extracted.

5.3 BERT Measurement and BERT Scan Measurements on High-speed Serial Patterns

In addition to jitter measurement, bit-error-rate (BER) measurements are often sought for high-speed serial patterns. At a minimum, a BER tester (BERT) essentially samples a high-speed digital pattern at a fixed delay value and compares the sampled pattern with an expected pattern that is stored in an on-board memory. It then counts the number of times the high-speed pattern is received erroneously and computes a BER number. Systems-interconnect budgets define a maximum BER for a certain high-speed link, so a BER measurement is a standard measurement in the area of high-speed digital design and test. Apart from the need for high-speed samplers, modern BERTs may incorporate fine delay circuitry (using phase interpolators or analog delay lines) in order to control the placement of the sampling point. The reason is the non-deterministic arrival time of signal under tests. That is, modern BERTs are expected to be agnostic to path delays, so the sampling point has to be programmable. In addition, the presence of delay circuitry allows one to perform a BERT scan measurement in which multiple BER measurements are performed, each with a different fixed sampling delay. The sampling delay is progressively increased or decreased in this test. Such measurement gives an indication of the margin that is available in a given link.

Figure 21:
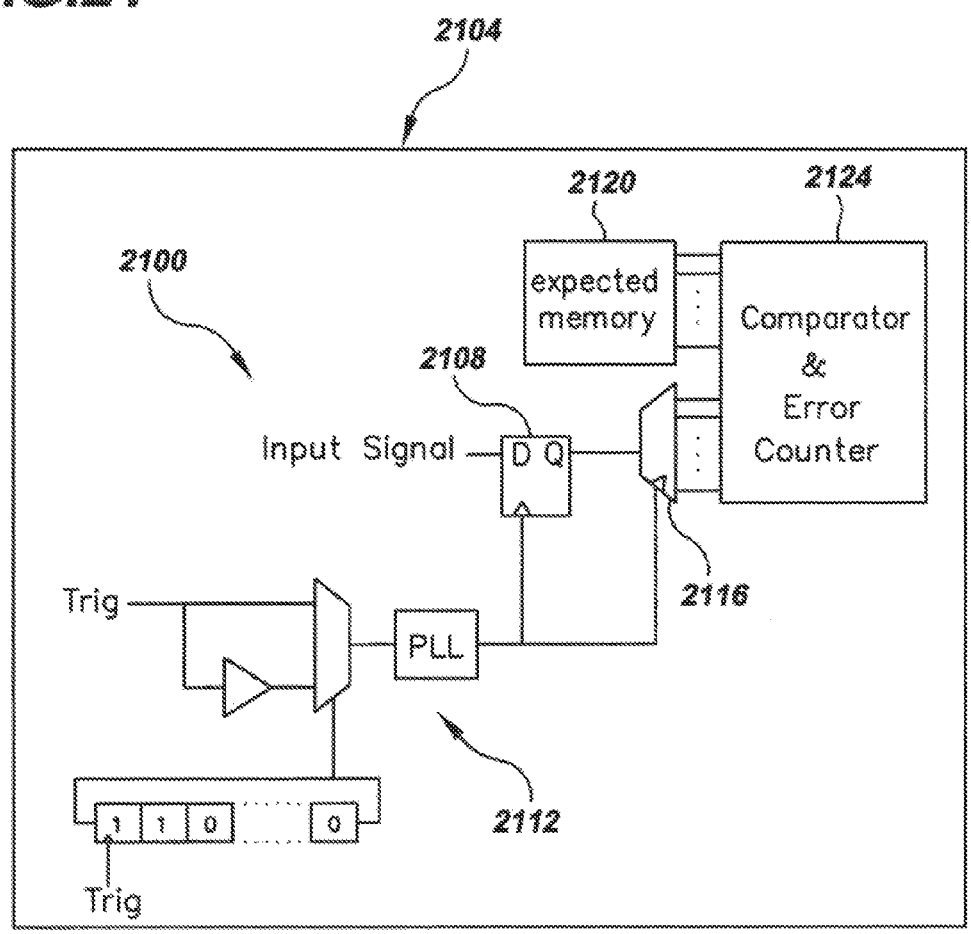
FIG. 21 is a high-level schematic diagram of a signal-integrity measurement system of the present disclosure in which the sampler is coupled to pattern comparison and error counting hardware to perform various kinds of bit-error-rate tests.

FIG. 21 illustrates a signal-integrity measurement system 2100 that may be implemented to construct a particularly compact BERT 2104. As can be seen in FIG. 21, system 2100 may include a sampler (here a D-FF 2108) and a time-base generator 2112 in substantially the same way they are present in system 600 of FIG. 6. A primary difference from system 600, however, is the nature of the processing algorithm at the output of the D-FF 2108. In the context of FIG. 21, time-base generator 2112 provides the control of the sampling instants of system 2100 (i.e., BERT 2104), and D-FF 2108 performs the sampling operation. Once the SUT is sampled using D-FF 2108, it can be slowed down (de-serialized), for example, using a de-mux 2116, and then compared to an expected signal (not illustrated) stored in an onboard expected memory 2120 using, for example, an onboard comparator and error counter 2124. It is noted that the deserialization step is not necessary. It is only there if on-board memory 2120 and comparator/error counter 2124 cannot run at the frequency of the high-speed serial pattern.

It is also noted that the fixed-delay version of the time-base generation, as opposed to the ramp embodiment, is used in this embodiment. Specifically, in a bare-minimum BER measurement, time-base generator 2112 may be programmed to generate a fixed delay that places the sampling instant of D-FF 2108 at the optimum location with respect to the incoming stream. Then, the stream is run continuously and the BER computed by comparator/error counter 2124. Alternatively, for a BERT scan measurement, time-base generator 2112 may be repeatedly programmed to generate fixed delays of increasing or decreasing values and the BER is measured for each such delay.

5.4 General-Purpose On-Chip Signal Integrity Measurement

Figure 22:
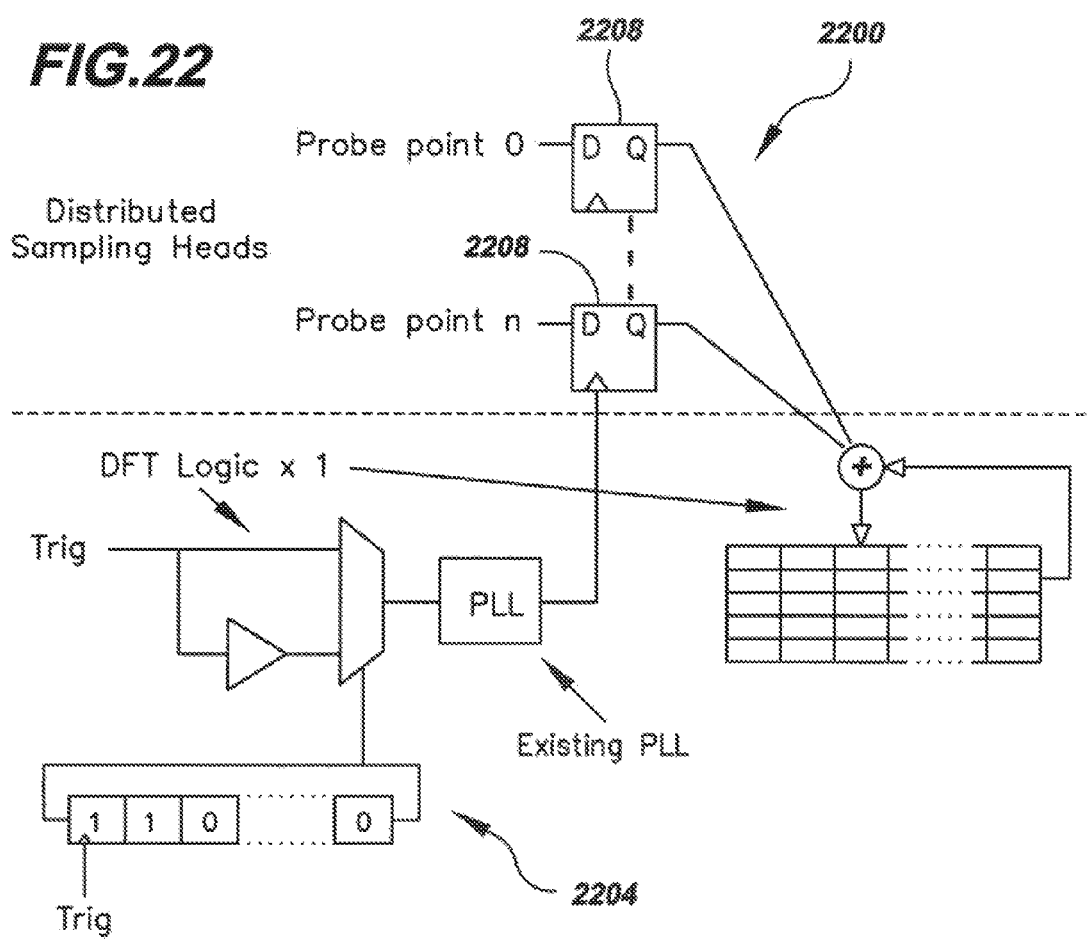
FIG. 22 is a high-level schematic diagram of a signal-integrity measurement system of the present disclosure deployed in an integrated circuit.

FIG. 22 illustrates a general deployment of a signal-integrity measurement system 2200 in which a single time-base generator 2204 is coupled to multiple samplers, here D-FFs 2208. These samplers may be placed at strategic locations within and integrated circuit chip or chip system (not shown), for example, an ASIC or an FPGA, and coupled to external contacts (not shown) so as to provide multiple sampling points, i.e., Probe points 0 to n. For example, the sampling points can be placed between major blocks (not shown) in a design to evaluate the integrity of the clock distribution network. Alternatively, the samplers can be placed around heavy DSP blocks (not shown) within, for example, an ASIC or an FPGA. Such blocks may significantly stress the power supply network and cause failures due to the resulting delay degradation. In any case, an important point is that a single time-base generator, such as time-base generator 2204, can be coupled to multiple sampling elements, such as D-FFs 2208. The sampling elements can be extremely compact and can be readily synthesized within a design. Time-base generator 2204 consumes a little more area, but only one instance of it needs to be implemented within the context of on-chip jitter or signal integrity measurement, making system 2200 very efficient in terms of the amount of on-chip spaced occupied.

Systems, components thereof and methods of the present disclosure have significant commercial possibilities. As a built-in macro, a signal-integrity measurement system of the present disclosure could be deployed in ASICs as well as FPGAs and other integrated circuitry. FPGAs are finding widespread use in the industry because of their flexibility and cost benefits. However, FPGA technology is inherently noisy. To avoid these noise issues, designers often adopt quite conservative design methodologies. By allowing the measurement of signal integrity inside an FPGA, designers can potentially achieve more aggressive performance levels using FPGA technology. The significance of the technology of the present disclosure is that it does not require any special features to be integrated inside the FPGA. This is unprecedented in the industry. The end user of any FPGA can employ this technology without having to require the FPGA manufacturer to construct special analog features.

5.4 General-Purpose On-Chip Signal Integrity Measurement

FIG. 22 illustrates a general deployment of a signal-integrity measurement system 2200 in which a single time-base generator 2204 is coupled to multiple samplers, here D-FFs 2208. These samplers may be placed at strategic locations within and integrated circuit chip or chip system (not shown), for example, an ASIC or an FPGA, and coupled to external contacts (not shown) so as to provide multiple sampling points, i.e., Probe points 0 to n. For example, the sampling points can be placed between major blocks (not shown) in a design to evaluate the integrity of the clock distribution network. Alternatively, the samplers can be placed around heavy DSP blocks (not shown) within, for example, an ASIC or an FPGA. Such blocks may significantly stress the power supply network and cause failures due to the resulting delay degradation. In any case, an important point is that a single time-base generator, such as time-base generator 2204, can be coupled to multiple sampling elements, such as D-FFs 2208. The sampling elements can be extremely compact and can be readily synthesized within a design. Time-base generator 2204 consumes a little more area, but only one instance of it needs to be implemented within the context of on-chip jitter or signal integrity measurement, making system 2200 very efficient in terms of the amount of on-chip spaced occupied.

Systems, components thereof and methods of the present disclosure have significant commercial possibilities. As a built-in macro, a signal-integrity measurement system of the present disclosure could be deployed in ASICs as well as FPGAs and other integrated circuitry. FPGAs are finding widespread use in the industry because of their flexibility and cost benefits. However, FPGA technology is inherently noisy. To avoid these noise issues, designers often adopt quite conservative design methodologies. By allowing the measurement of signal integrity inside an FPGA, designers can potentially achieve more aggressive performance levels using FPGA technology. The significance of the technology of the present disclosure is that it does not require any special features to be integrated inside the FPGA. This is unprecedented in the industry. The end user of any FPGA can employ this technology without having to require the FPGA manufacturer to construct special analog features.

In addition to the built-in-test world, this technology can be readily deployed in compact instrument modules, such as the DJ60 and DJ518 modules available from DFT Microsystems Canada, Inc., Montreal, Canada. The small size and low-cost nature of this invention will allow such module manufacturers to offer jitter measurement capability at a fraction of the cost of conventional technology.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A tester for testing a circuit under test, comprising:
 a time-base generator for generating a time-base signal as a function of a first clock signal, said time-base generator including:
 modulation circuitry for generating a rapidly varying phase signal as a function of said first clock signal; and
 a phase filter for receiving the rapidly varying phase signal and filtering therefrom unwanted high-frequency phase components so as to output the time-base signal; and
 a sampler for sampling a signal under test as a function of the time-base signal so as to output a sampled signal.

2. The tester of claim 1, wherein said modulation circuitry includes clock-selection circuitry for continually selecting from among differing-delay versions of the first clock signal so as to generate the rapidly varying phase signal.

3. The tester of claim 2, wherein said modulation circuitry further includes a delay element for receiving said first clock signal and outputting a second clock signal phase-shifted relative to the first clock signal, said clock-selection circuitry comprising a multiplexer for receiving the first clock signal and the second clock signal.

4. The tester of claim 3, wherein said delay element is programmable in coarse increments.

5. The tester of claim 3, wherein said multiplexer includes an output and a select port, said modulation circuitry also including a selection signal generator in operative communication with said select port of said multiplexer and configured to generate a high-frequency selection signal for causing said multiplexer to continually select between the first clock signal and the second clock signal.

6. The tester of claim 5, wherein the high-frequency selection signal of said multiplexer is synchronized with the first and second clock signals.

7. The tester of claim 5, wherein said selection signal generator comprises a circular memory containing digital data.

8. The tester of claim 7, wherein said digital data is configured in accordance with sigma-delta modulation.

9. The tester of claim 7, wherein said digital data is configured in accordance with first-order pulse-density modulation.

10. The tester of claim 7, wherein said digital data is configured in accordance with pulse-width modulation.

11. The tester of claim 7, wherein said digital data represents a sigma-delta modulated constant ramp signal.

12. The tester of claim 11, wherein said digital data represents a first-order pulse-density modulated ramp signal.

13. The tester of claim 11, wherein said digital data represents a pulse-width modulated ramp signal.

14. The tester of claim 7, wherein said digital data represents a sigma-delta modulated DC signal.

15. The tester of claim 14, wherein said digital data represents a first-order pulse-density modulated DC signal.

16. The tester of claim 7, wherein said digital data represents a pulse-width modulated DC signal.

17. The tester in claim 5, wherein said selection signal generator comprises a sigma-delta modulator driven by a digital word generator.

18. The tester of claim 17, wherein said digital word generator represents a constant ramp output.

19. The tester of claim 17, wherein said digital word generator represents a constant, unchanging output.

20. The tester of claim 1, wherein said sampler comprises an analog-to-digital converter.

21. The tester of claim 1, wherein said sampler comprises a D-flip-flop.

22. The tester of claim 1, further comprising a voltage comparator for receiving the sampled signal.

23. The tester of claim 22, wherein said voltage comparator is configured to sample the signal under test so as to generate the sampled signal.

24. The tester of claim 22, wherein the sampled signal has a voltage and the tester further comprises a programmable reference generator for generating a reference voltage signal for sweeping said voltage, said voltage comparator configured to compare the swept reference voltage signal and the sampled signal with one another.

25. The tester of claim 22, wherein said voltage comparator has an output, the tester further including memory for storing the output for further analysis.

26. The tester of claim 1, wherein said phase filter comprises a phase-locked loop.

27. The tester of claim 1, wherein said modulation circuitry generates the rapidly varying phase signal as a function of digital data.

28. The tester of claim 27, wherein said digital data is configured in accordance with sigma-delta modulation.

29. The tester of claim 27, wherein said digital data is configured in accordance with first-order pulse-density modulation.

30. The tester of claim 27, wherein said digital data is configured in accordance with pulse-width modulation.

31. The tester of claim 27, wherein said digital data represents a sigma-delta modulated constant ramp signal.

32. The tester of claim 27, wherein said digital data represents a sigma-delta modulated DC signal.

33. The tester of claim 1, wherein the tester performs a plurality of cycles and further comprises a memory controller and test data capture memory having a plurality of storage locations, said memory controller configured for repeatedly storing output of said sampler in said plurality of storage locations during said plurality of cycles.

34. The tester of claim 1, further comprising:
a plurality of samplers for receiving a corresponding plurality of signals under test, each of said plurality of samplers responsive to the time-base signal of said time-base generator; and
a digital signal processor for receiving output of said plurality of samplers.

35. The tester of claim 34, further comprising an oscillator for driving said time-base generator and the circuit under test.

36. The tester of claim 34, wherein the circuit under test is located on a first integrated circuit chip and said time-base generator is located on a second integrated circuit chip.

37. The tester of claim 1, wherein the circuit under test is located on a first integrated circuit chip and said time-base generator is located on a second integrated circuit chip.

38. The tester of claim 1, wherein the circuit under test and said time-base generator are located on a common chip.

39. The tester of claim 1, further comprising:
an expected data memory for providing an expected data signal; and
a digital comparator for comparing said sampling signal to said expected data signal.

40. The tester of claim 39, further comprising an error counter in communication with said digital comparator for counting mismatch errors between said sampling signal and said expected data signal.

41. The tester of claim 39, further comprising a demultiplexer, responsive to said time-base signal, for demultiplexing said sampling signal for input into said digital comparator.

42. The tester of claim 1, further comprising a plurality of probe points each having a corresponding respective sampler associated therewith that is responsive to said time-base signal.

43. A tester of claim 42, further comprising memory behind each of said plurality of probe points.

44. The tester of claim 1, further comprising a memory and a digital signal processor controller for selectively collecting said sampled signal from said sampler and storing said sampled signal in said memory.

45. A method of testing a circuit under test, comprising:
stimulating the circuit under test to produce a response signal under test;
generating a rapidly varying phase signal as a function of a first clock signal;
filtering the rapidly varying phase signal to remove unwanted high-frequency phase components so as to generate a fine resolution time-base signal; and
sampling the response signal under test as a function of the time-base signal so as to provide a sampled signal under test.

46. The method of claim 45, wherein said generating of the rapidly varying phase signal includes continually selecting from among differing-delay versions of the first clock signal.

47. The method of claim 46, wherein said continually selecting from among said differing-delay versions of the first clock signal includes selecting from among said differing-delay versions as a function of a sigma-delta modulated repeating waveform.

48. The method of claim 47, wherein said continually selecting from among said differing-delay versions of the first clock signal includes selecting from among said differing-delay versions as a function of a digital representation of a sigma-delta modulated repeating waveform.

49. The method of claim 47, wherein said continually selecting from among said differing-delay versions of the first clock signal includes selecting from among said differing-delay versions as a function of a sigma-delta modulated constant ramp signal.

50. The method of claim 47, wherein said continually selecting from among said differing-delay versions of the first clock signal includes selecting from among said differing-delay versions as a function of a sigma-delta modulated DC signal.

51. The method of claim 46, wherein said generating of the rapidly varying phase signal includes delaying the first clock signal to create a second clock signal phase-shifted relative to the first clock signal, and rapidly selecting between the first clock signal and second clock signal in response to a digital signal so as to generate the rapidly varying phase signal.

52. The method of claim 51, wherein said delaying of the first clock signal includes imparting a coarse delay into the first clock signal.

53. The method of claim 51, further comprising storing the digital signal in a circular memory, said generating of the rapidly varying phase signal including cycling through the digital signal.

54. The method of claim 51, further comprising encoding the digital signal with the output of a sigma-delta modulator.

55. The method of claim 51, wherein said encoding of the digital signal includes encoding the digital signal in accordance with first-order pulse-density modulation.

56. The method of claim 51, wherein said encoding of the digital signal includes encoding the digital signal in accordance with first-order pulse-width modulation.

57. The method of claim 51, wherein said encoding of the digital signal includes encoding the digital signal with a sigma-delta modulated constant ramp signal.

58. The method of claim 51, wherein said encoding of the digital signal includes encoding the digital signal with a sigma-delta modulated DC signal.

59. The method of claim 46, wherein said continually selecting from among said differing-delay versions of the first clock signal includes cyclically reading a series of selection bits from a circular memory.

60. The method of claim 45, wherein said filtering of the rapidly varying phase signal includes filtering the rapidly varying phase signal using a phase-locked loop.

61. The method of claim 45, wherein said filtering of the rapidly varying phase signal includes filtering the rapidly varying phase signal using a delay-locked loop.

62. The method of claim 45, wherein said sampling of the signal under test includes sampling said test data using a D-flip-flop.

63. The method of claim 45, wherein said sampling of the signal under test includes sampling said test data using an analog-to-digital converter.

64. The method of claim 45, further comprising comparing the sampled signal under test to a reference signal.

65. The method of claim 64, wherein said comparing of the sampled signal under test to the reference signal includes comparing the sampled signal under test to a voltage-swept reference signal.

66. The method of claim 45, wherein the sampled signal under test has a first frequency and the time-base signal has a second frequency selected to ensure that a least common multiple exists as between the first frequency and the second frequency.

67. The method of claim 45, wherein the response signal under test includes a high-speed repeating serial pattern that is equivalent to a differing frequency clock signal.

68. The method of claim 45, further comprising calculating a bit-error rate as a function of the sampled signal under test.

69. The method of claim 68, wherein the calculating of the bit-error rate includes comparing the sampled signal under test to an expected data signal.

70. The method of claim 69, wherein the sampled signal under test has a speed and the method further comprises slowing the speed prior to comparing the sampled signal to the expected data signal for the purpose of calculating the bit-error rate.

71. The method of claim 45, wherein said sampling of the signal under test is performed over a plurality of cycles and the method further comprises writing and accumulating said sampling signal under test to a particular memory space over the plurality of cycles.

72. The method of claim 45, wherein said sampling of the signal under test is performed over a plurality of probe sites and the method further comprises writing the sampled signal under test from each of the plurality of probe sites to a respective memory.

* * * * *